(12) United States Patent
Wu

(10) Patent No.: US 7,510,955 B2
(45) Date of Patent: Mar. 31, 2009

(54) METHOD OF FABRICATING MULTI-FIN FIELD EFFECT TRANSISTOR

(75) Inventor: Hsiao-Che Wu, Taoyuan Hsien (TW)

(73) Assignee: ProMOS Technologies Inc., Hsinchu (TW)

(*) Notice: Subject to any disclaimer, the term of this patent is extended or adjusted under 35 U.S.C. 154(b) by 267 days.

(21) Appl. No.: 11/309,376

(22) Filed: Aug. 2, 2006

(65) Prior Publication Data

US 2007/0278595 A1 Dec. 6, 2007

(30) Foreign Application Priority Data

Jun. 5, 2006 (TW) .............................. 95119811 A

(51) Int. Cl.
*H01L 21/336* (2006.01)
(52) U.S. Cl. ..................... 438/589; 438/270; 438/282; 438/284; 438/303; 438/305; 257/135; 257/136; 257/242; 257/329; 257/E27.091; 257/E29.118; 257/E29.274; 257/E29.313; 257/E29.318; 257/E29.262; 257/E21.41; 257/E21.629; 257/E21.643
(58) Field of Classification Search ................ 438/584, 438/589, 270, 284, 282, 303, 305; 257/135–136, 257/242, 329, E27.091, E27.095–E27.096, 257/E29.118, E29.274, E29.313, E29.318, 257/E29.262, E21.41, E21.629, E21.643
See application file for complete search history.

(56) References Cited

U.S. PATENT DOCUMENTS

2004/0227181 A1* 11/2004 Yeo et al. .................... 257/328
2005/0077553 A1* 4/2005 Kim et al. ................... 257/288

* cited by examiner

*Primary Examiner*—Zandra Smith
*Assistant Examiner*—Maliheh Malek
(74) *Attorney, Agent, or Firm*—Jianq Chyun IP Office

(57) ABSTRACT

A multi-fin field effect transistor includes a substrate, an oxide layer, a conductive layer, a gate oxide layer, and a doped region is provided. The substrate is surrounded by a trench, and there are at least two fin-type silicon layers formed in the substrate in a region prepared to form a gate thereon. The oxide layer is disposed in the trench and the top surface of the oxide layer is lower than that of the fin-type silicon layers. The conductive layer is disposed in the region prepared to form a gate. The top surface of the conductive layer is higher than that of the fin-type silicon layers. The gate oxide layer is disposed between the conductive layer and the fin-type silicon layers and disposed between the conductive layer and the substrate. The doped region is disposed in the substrate on both sides of the conductive layer.

13 Claims, 28 Drawing Sheets

METHOD OF FABRICATING MULTI-FIN FIELD EFFECT TRANSISTOR

CROSS-REFERENCE TO RELATED APPLICATION

This application claims the priority benefit of Taiwan application serial no. 95119811, filed on Jun. 5, 2006. All disclosure of the Taiwan application is incorporated herein by reference.

BACKGROUND OF THE INVENTION

1. Field of Invention

The present invention relates to a field effect transistor and a fabricating method thereof, and more particularly to a multi-fin field effect transistor and a fabricating method thereof.

2. Description of Related Art

With the device size gradually shrunken, in order to satisfy multiple applications of an integrated circuit in future, currently, the transistor shape of a semiconductor device is developed from a planar gate structure to a vertical gate structure.

Now, some patents have disclosed relevant technology focusing on this aspect. For example, US Patent No. 2004/0227181 has disclosed a multi-channel transistor and a fabricating method thereof. The aforementioned document is the reference of the present invention.

However, the conventional semiconductor device with a vertical gate structure still has some problems that are not solved. For example, the most serious problem of the conventional device is the floating body effect. The floating body effect refers to that, in a semiconductor device, charges may be accumulated in channels. Once the charges are accumulated in the channels to some extent, not only the threshold voltage of the semiconductor device is affected, but also the current in a drain region is suddenly increased. Furthermore, the floating body effect causes the semiconductor device turn on automatically without applying a voltage, thereby influencing reliability and stability of the semiconductor device and causing leakage current.

From the other aspect, the semiconductor device is mostly formed through an epitaxial process. However, the epitaxial process takes a long time and it is always difficult to clean the surface of an epitaxial layer. In addition, the epitaxial process cannot be readily controlled, resulting in facet effect and influencing the subsequent processes.

SUMMARY OF THE INVENTION

Accordingly, one objective of the present invention is to provide a multi-fin field effect transistor, so as to avoid the floating body effect and the problems caused by the epitaxial process.

Another objective of the present invention is to provide a method of fabricating a multi-fin field effect transistor, so as to inhibit the float body effect and enhance reliability and stability of a device.

The multi-fin field effect transistor provided by the present invention comprises a substrate, an oxide layer, a conductive layer, a gate oxide layer, and a doped region. The substrate is surrounded by a trench, and at least two fin-type silicon layers are formed in the substrate in a region prepared to form a gate thereon. The oxide layer is disposed in the trench and the top surface of the oxide layer is lower than that of the fin-type silicon layers. The conductive layer is disposed in the region prepared to form the gate thereon. The top surface of the conductive layer is higher than that of the fin-type silicon layers. The gate oxide layer is disposed between the conductive layer and the fin-type silicon layers and disposed between the conductive layer and the substrate. The doped region is disposed in the substrate on both sides of the conductive layer.

The method of fabricating the multi-fin field effect transistor further provided by the present invention comprises providing a substrate having at least one trench therein, wherein the top surface of the substrate is covered with a pad layer; filling a first oxide layer into the trench and removing a portion of the pad layer to form an opening; subsequently, forming a first circular or rectangular insulating layer and a second circular or rectangular insulating layer interlaced with each other on the sidewall of the opening; forming a mask layer above the substrate to cover a portion of the first circular or rectangular insulating layer and second circular or rectangular insulating layer and exposing a region prepared to form a gate; removing a portion of the second circular or rectangular insulating layer by using the mask layer as a mask, so as to expose a portion of the surface of the substrate; removing a portion of the substrate by using the mask layer and the first circular or rectangular insulating layer as masks, so as to form two fin-type layers; removing the mask layer; forming a gate oxide layer on the sidewalls of the two fin-type layers and the surface of the substrate; forming a conductive layer in the region above the substrate; removing the first circular or rectangular insulating layer, a portion of the first oxide layer and the second circular or rectangular insulating layer which are not covered by the conductive layer, so as to expose the surface of the substrate; and finally, forming a lightly doped region in the substrate by using the conductive layer as a mask.

The multi-fin field effect transistor and the fabricating method thereof provided by the present invention have a multi-channel structure, thus the electrical capacity of a device is increased, so as to improve the efficiency of the device and avoid the floating body effect caused by excessive accumulation of charges. In addition, the present invention does not employ the epitaxial process and thus does not have the problems such as the process takes a long time, the surface of the epitaxial layer is always difficult to be cleaned, and the process cannot be readily controlled and generates facet effect, thereby influencing subsequent processes.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
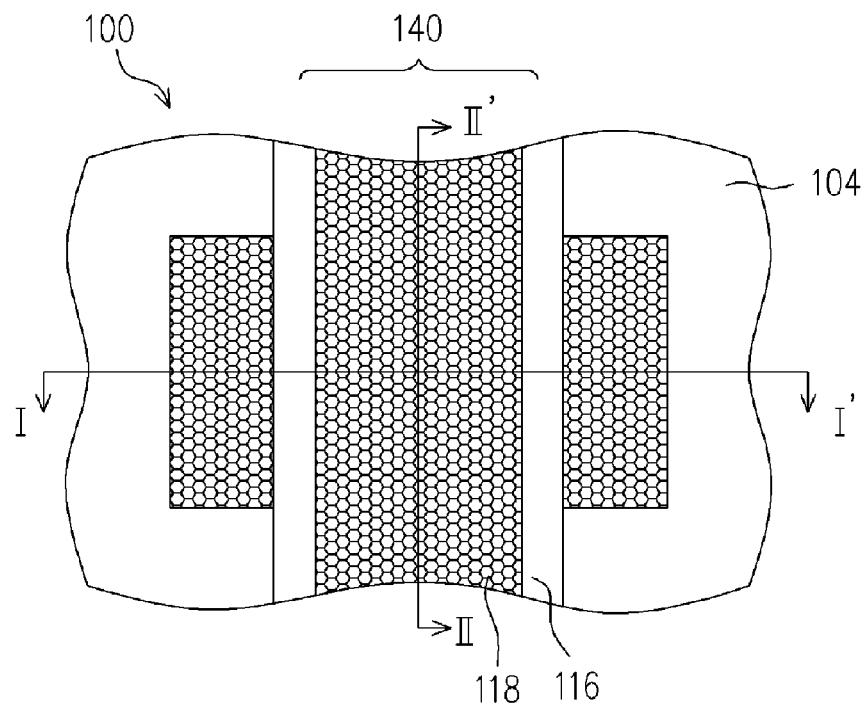
FIG. 1A is a top view of the multi-fin field effect transistor according to one embodiment of the present invention.
Figure 1B:
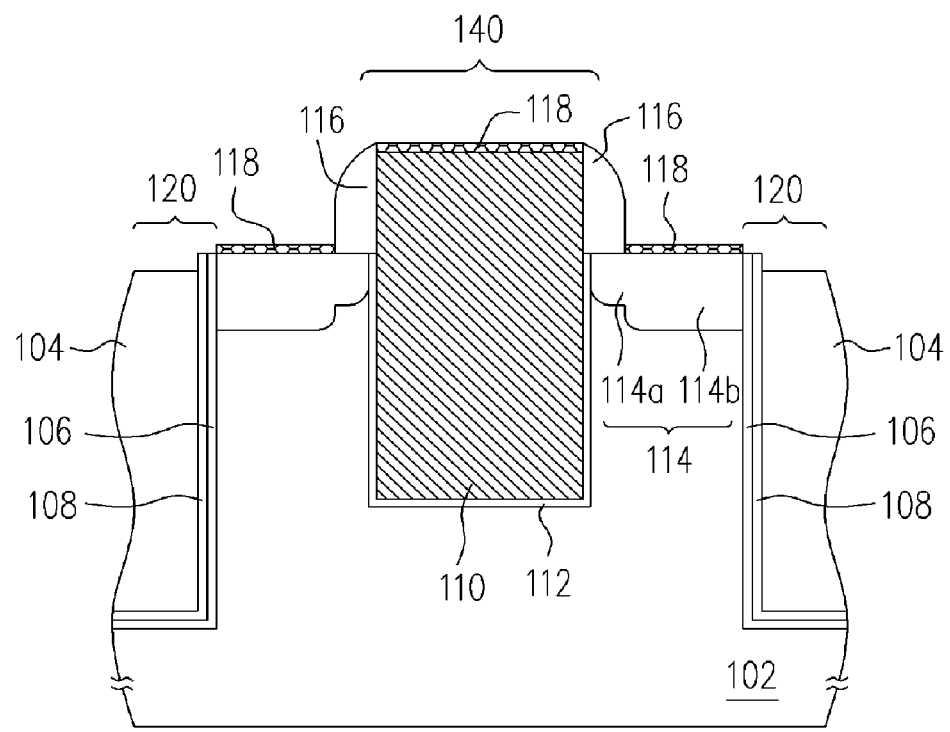
FIG. 1B is a schematic sectional view of FIG. 1A along the section line I-I'.
Figure 1C:
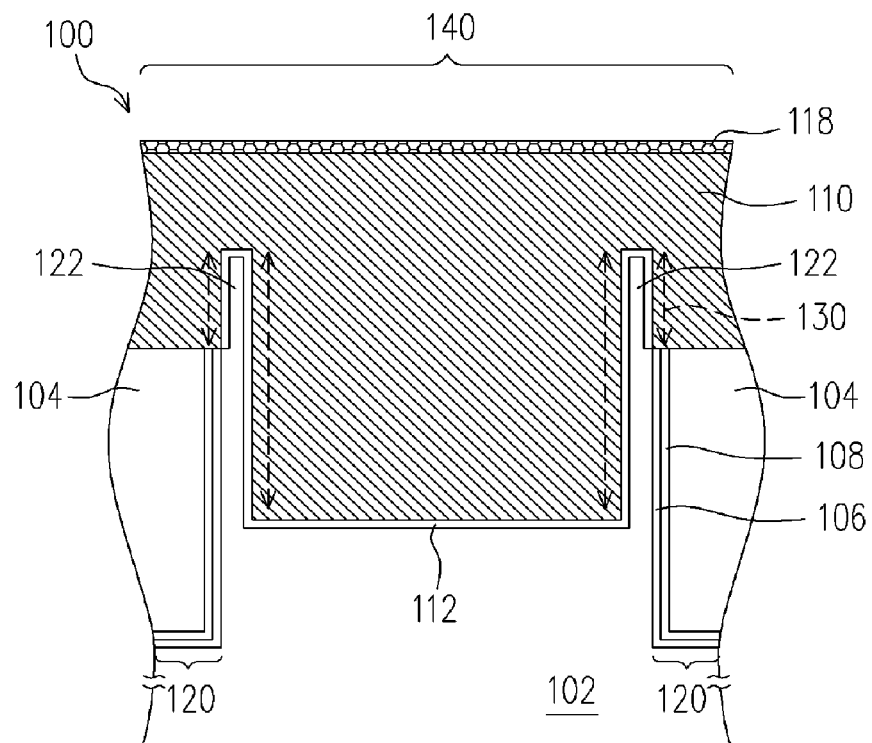
FIG. 1C is a schematic sectional view of FIG. 1A along the section line II-II'.
Figure 1D:
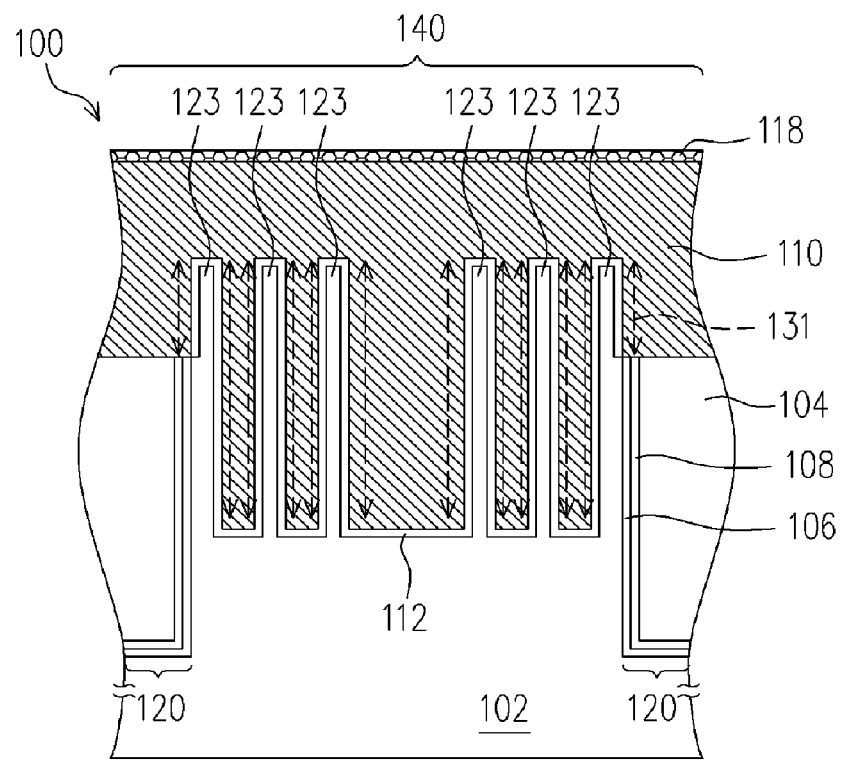
FIG. 1D is a schematic sectional view of FIG. 1A along the section line II-II' according to another embodiment of the present invention.

FIG. 1A is a top view of the multi-fin field effect transistor according to one embodiment of the present invention. FIG. 1B is a schematic sectional view of FIG. 1A along the section line I-I'. FIG. 1C is a schematic sectional view of FIG. 1A along the section line II-II'. FIG. 1D is a schematic sectional view of FIG. 1A along the section line II-II' according to another embodiment of the present invention.

Referring to FIGS. 1A, 1B and 1C, the multi-fin field effect transistor 100 in the embodiment comprises a substrate 102, an oxide layer 104, a conductive layer 110, a gate oxide layer 112, and a doped region 114. The substrate 102 is, for example, a silicon substrate. The region 102 surrounded by a trench 120 is an active region of a transistor, and at least two fin-type silicon layers 122 are formed in the substrate 102 in a region 140 prepared to form a gate. The oxide layer 104 is disposed in the trench 120, and the top surface of the oxide layer 104 is lower than that of the fin-type silicon layers 122.

Referring to FIGS. 1A, 1B, and 1C, the conductive layer 110 is disposed in the region 140 of the substrate 102 and fills the gap between the fin-type silicon layers 122. The top surface of the conductive layer 110 is higher than that of the fin-type silicon layers 122. The material of the conductive layers 110 is, for example, poly-silicon or doped poly-silicon. Additionally, the gate oxide layer 112 is disposed between the conductive layer 110 and the fin-type silicon layers 122, and between the conductive layer 110 and the substrate 102. The material of the gate oxide layer 112 is, for example, silicon oxide. The doped region 114 is disposed in the substrate 102 on both sides of the conductive layer 110, and comprises a lightly doped region 114a and a heavily doped region 114b.

In one embodiment, the multi-fin field effect transistor 100 further comprises a lining oxide layer 106 and a lining nitride layer 108. The lining oxide layer 106 is disposed on the surface of the substrate 102 on the sidewall of the trench 120, and the lining nitride layer 108 is disposed between the oxide layer 104 and the lining oxide layer 106. In another embodiment, the multi-fin field effect transistor 100 further comprises a spacer 116 disposed on the substrate 102 on both sides of the conductive layer 110, and covering a portion of the doped region 114. The material of the spacer 116 is, for example, silicon oxide or silicon nitride.

In another embodiment, the multi-fin field effect transistor 100 further comprises a metal silicide layer 118 disposed on the surfaces of the conductive layer 110 and the doped region 114. The material of the metal silicide layer 118 is, for example, cobalt silicide, titanium silicide, tungsten silicide, tantalum silicide, molybdenum silicide, and nickel silicide.

It should be particularly indicated that the fin-type silicon layers 122 are disposed in the substrate 102 among the doped region 114, and the two sidewalls of the fin-type silicon layer 122 can sense the electric field caused by the conductive layer 110. Therefore, two channel regions 130 are formed on both sides of each of the fin-type silicon layers 122, thereby increasing the firing current of a device.

The multi-fin field effect transistor provided by the present invention enhances electrical capacity of a device by using the multi-channel design, so as to improve the efficiency of the device and prevent the charges from being excessively accumulated to generate the floating body effect, thereby influencing the reliability and stability of the device.

Only two fin-type silicon layers are shown in the above embodiment (as shown by 122 in FIG. 1C). But the present invention is not limited to comprise only two fin-type silicon layers. More than two fin-type silicon layers may be disposed in the substrate in the region prepared to form a gate. Referring to FIG. 1D, it is a schematic sectional view of FIG. 1A along the section line II-II' according to another embodiment of the present invention. Six fin-type silicon layers 123 are shown in FIG. 1D to generate 12 channel regions 131. Of course, in the present invention, the number of the fin-type silicon layers is not limited at all, and it may be determined optionally.

Next, an embodiment is given to illustrate the method of fabricating the multi-fin field effect transistor of the present invention. For example, the embodiment illustrates the method of fabricating the multi-fin field effect transistor with eight fin-type silicon layers.

FIGS. 2-9 are schematic views of the flow of the method of fabricating the multi-fin field effect transistor according to one embodiment of the present invention, wherein sub FIGS. (a) are schematic top views, sub FIGS. (b) are schematic sectional views along the section line A-A', and sub FIGS. (c) are schematic sectional views along the section line B-B'.

Figure 2A:
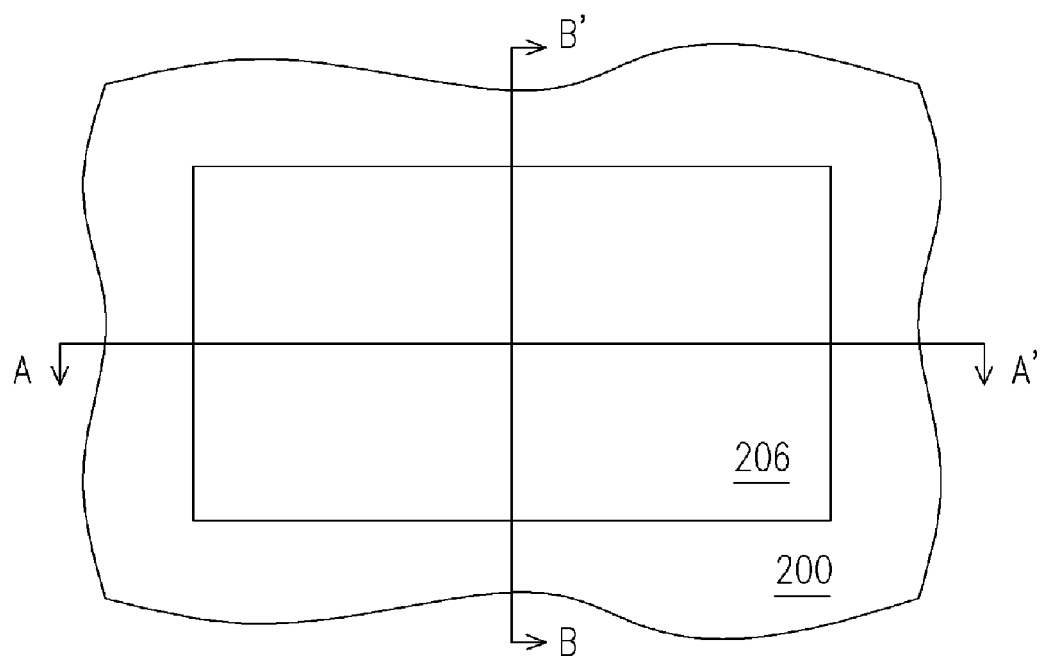
FIGS. 2-9 are schematic views of the flow of the method of fabricating the multi-fin field effect transistor according to one embodiment of the present invention, wherein sub FIGS. (a) are schematic top views, sub FIGS. (b) are schematic sectional views along the section line A-A', and sub FIGS. (c) are schematic sectional views along the section line B-B'.
Figure 2B:
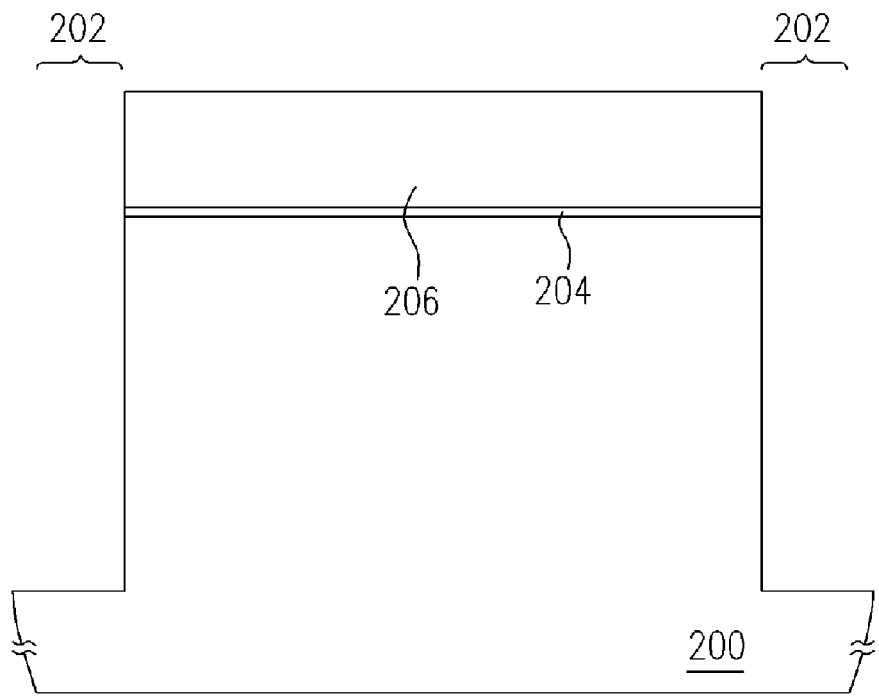
Figure 2C:
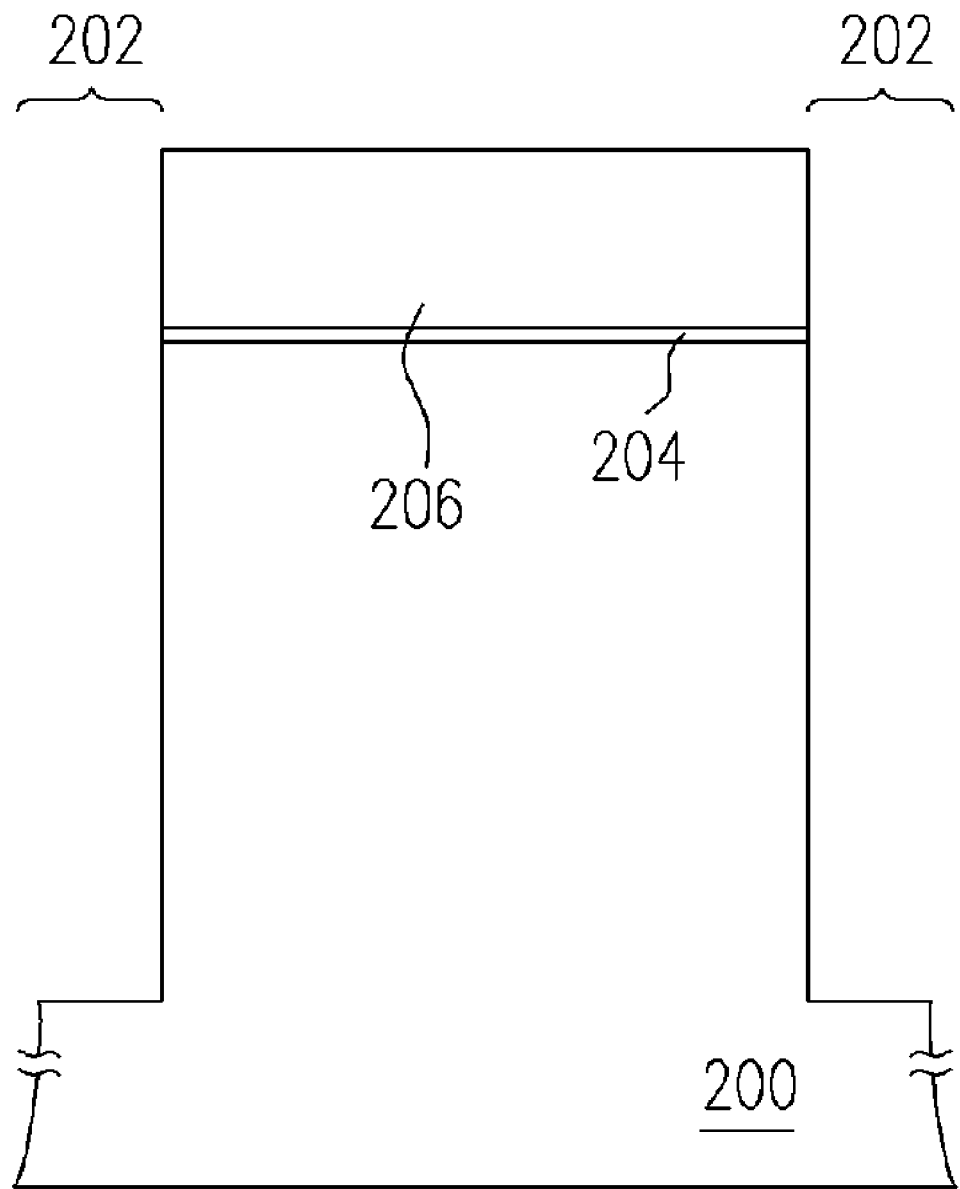

Referring to FIGS. 2(a), 2(b), and 2(c), a substrate 200 having at least one trench 202 is provided, and a pad layer is covered on the top surface of the substrate 200. In one embodiment, the pad layer, for example, comprises a pad oxide layer 204 and a pad nitride layer 206. The method of providing the substrate 200 having at least one trench 202 and whose top surface is covered with a pad layer, for example, comprises providing a substrate 200 and sequentially forming a pad oxide layer 204, a pad nitride layer 206 and a patterned photoresist layer (not shown) on the substrate 200; then, removing the pad nitride layer 206 and the pad oxide layer 204 not covered by the patterned photoresist layer, and a portion of the substrate 200 to form the trench 202; and removing the patterned photoresist layer.

Figure 3A:
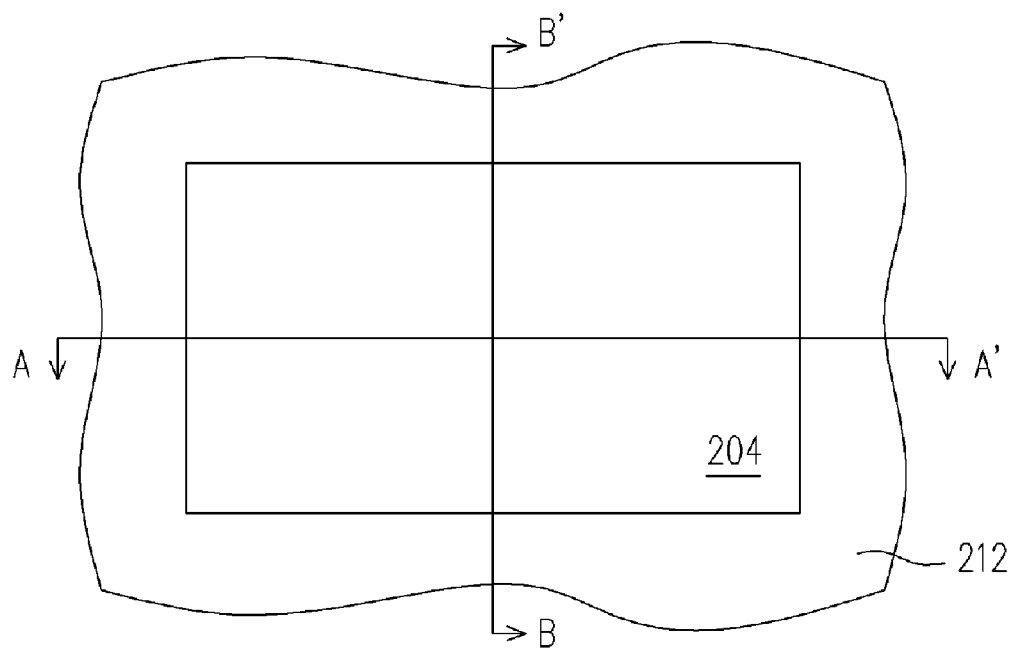
Figure 3B:
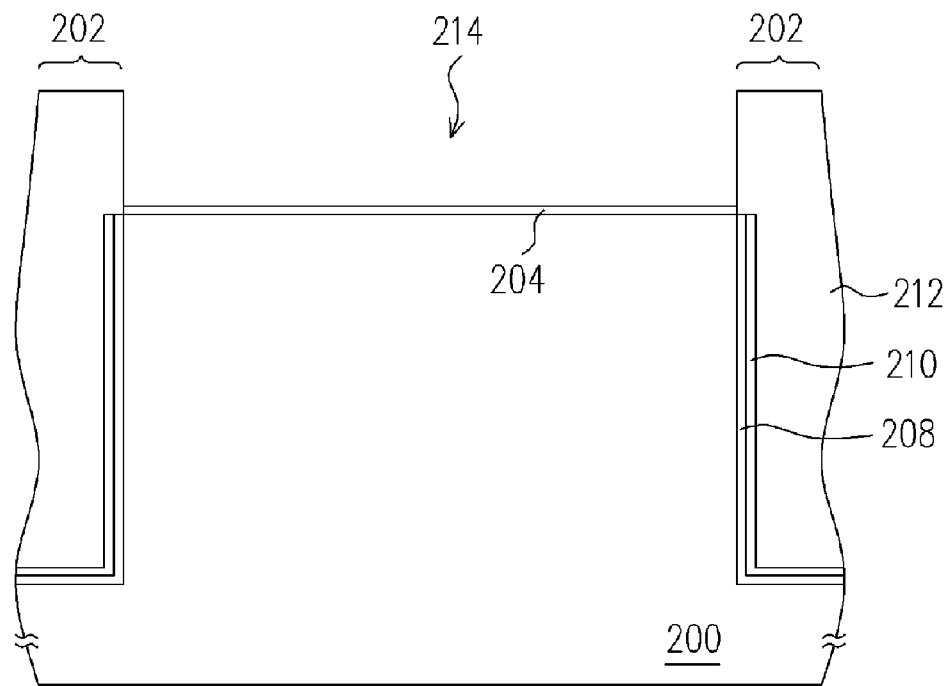
Figure 3C:
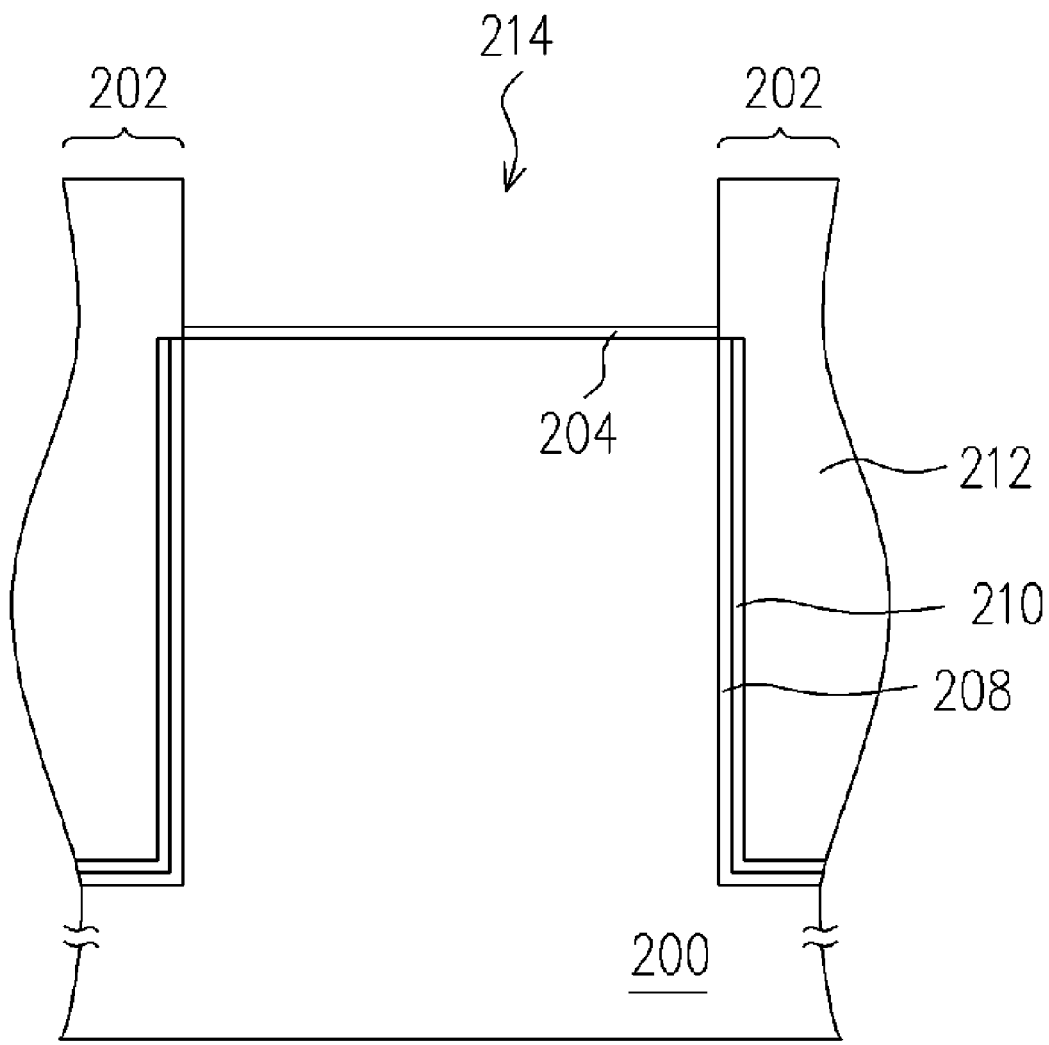

Then, referring FIGS. 3(a), 3(b), and 3(c), a lining oxide layer 208 and a lining nitride layer 210 are sequentially formed on the surface of the substrate 200 on the sidewall of the trench 202. Next, an oxide layer 212 is formed above the substrate 200 and filled into the whole trench 202. The method of forming the oxide layer 212 comprises, for example, performing a chemical vapor deposition (CVD) by using TEOS as a main gas supply; and performing an annealing treatment and a chemical mechanical polishing (CMP) until the pad nitride layer 206 is exposed. Afterward, the pad nitride layer 206 is removed to form an opening 214 exposing the surface of the pad oxide layer 204, and the method thereof is, for example, performing a wet etching process by using phosphoric acid as an etching solution.

Subsequently, referring to FIGS. 4(a), 4(b), and 4(c), first circular or rectangular insulating layers and second circular or rectangular insulating layers interlaced with each other are formed on the sidewall of the opening 214. In one embodiment, the first circular or rectangular insulating layers are silicon nitride layers, the second circular or rectangular insulating layers are silicon oxide layers. The first circular or rectangular insulating layers and the second circular or rectangular insulating layers interlaced with each other formed on the sidewall of the opening 214 sequentially comprise a circular nitride layer 218a, a circular oxide layer 220a, a circular nitride layer 218b, a circular oxide layer 220b, a circular nitride layer 218c, a circular oxide layer 220c, a circular nitride layer 218d, and an oxide layer 221. The forming method is, for example, as shown in FIGS. 10-14.

FIGS. 10-14 are schematic views of the flow of a method of fabricating circular nitride layers and circular oxide layers of the multi-fin field effect transistor according to one embodiment of the present invention, wherein sub FIGS. (a) are schematic top views, sub FIGS. (b) are schematic sectional views along the section line C-C', and sub FIGS. (c) are schematic sectional views along the section line D-D'.

Figure 10A:
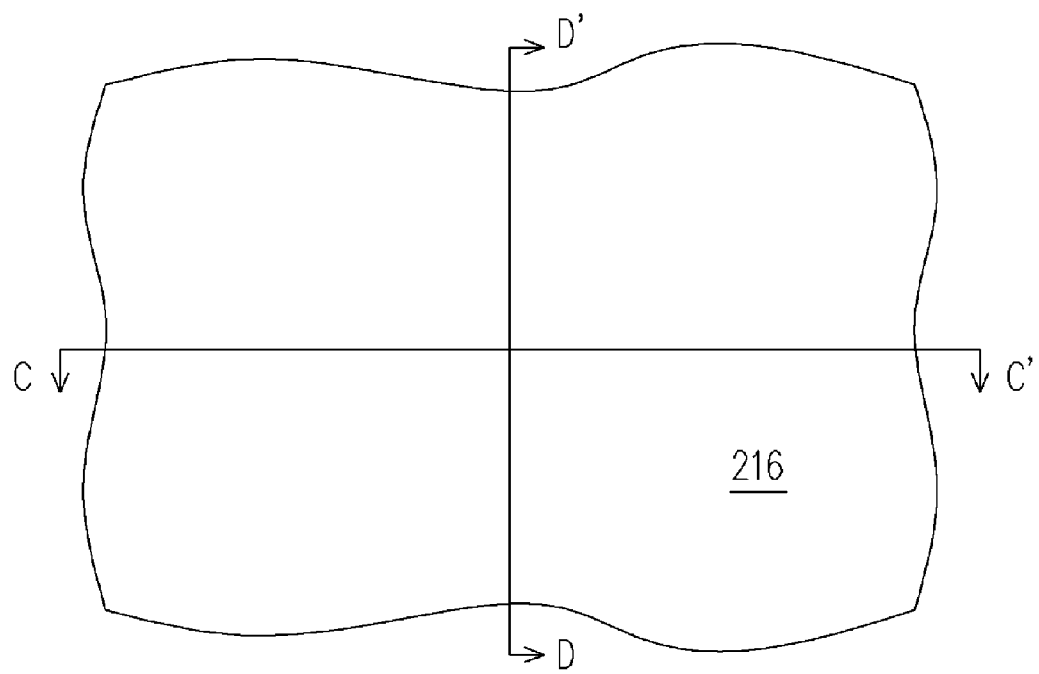
FIGS. 10-14 are schematic views of the flow of a method of fabricating a circular nitride layer and a circular oxide layer of the multi-fin field effect transistor according to one embodiment of the present invention, wherein sub FIGS. (a) are schematic top views, sub FIGS. (b) are schematic sectional views along the section line C-C', and sub FIGS. (c) are schematic sectional views along the section line D-D'.
Figure 10B:
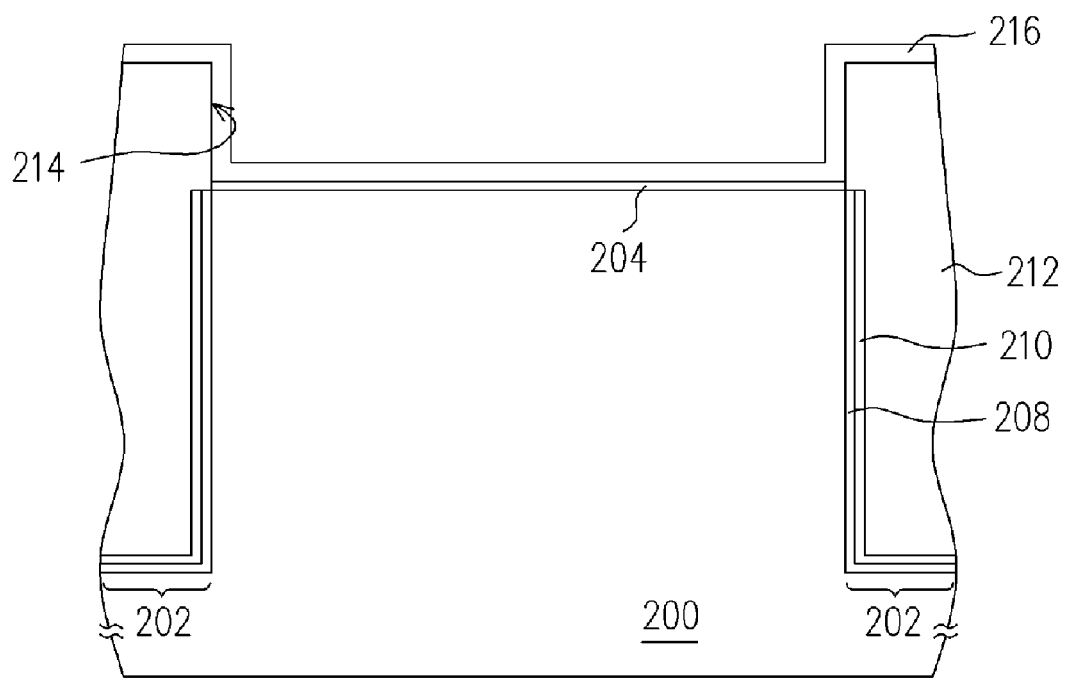
Figure 10C:
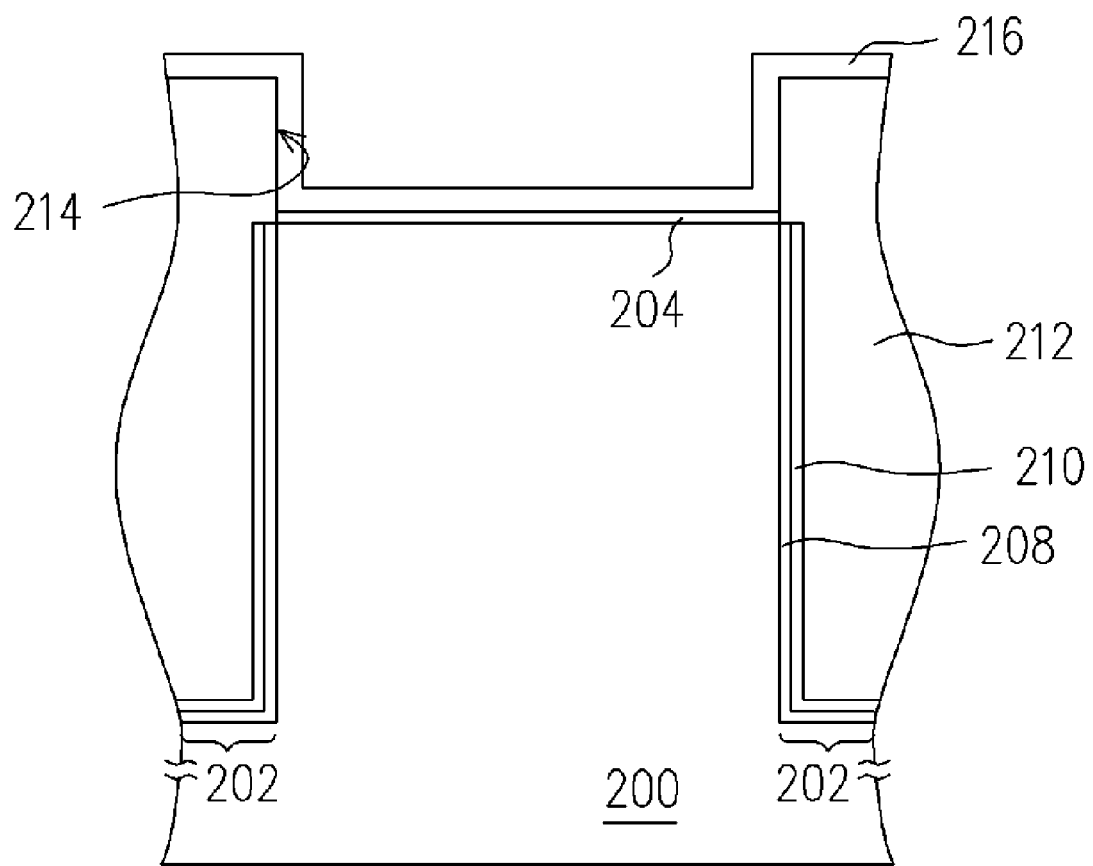

Referring to FIGS. 10(a), 10(b), and 10 (c), a nitride material layer 216 is conformably formed on the substrate 200 to cover the surface of the opening 214 and the surface of the oxide layer 212. The method of forming the nitride material layer 216 is, for example, CVD.

Figure 11A:
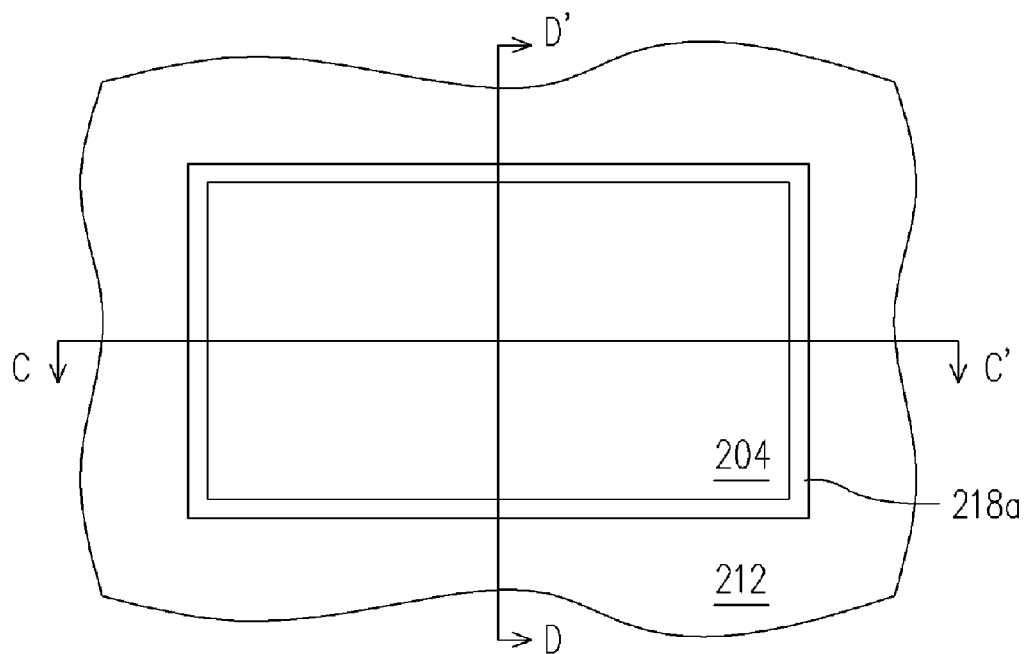
Figure 11B:
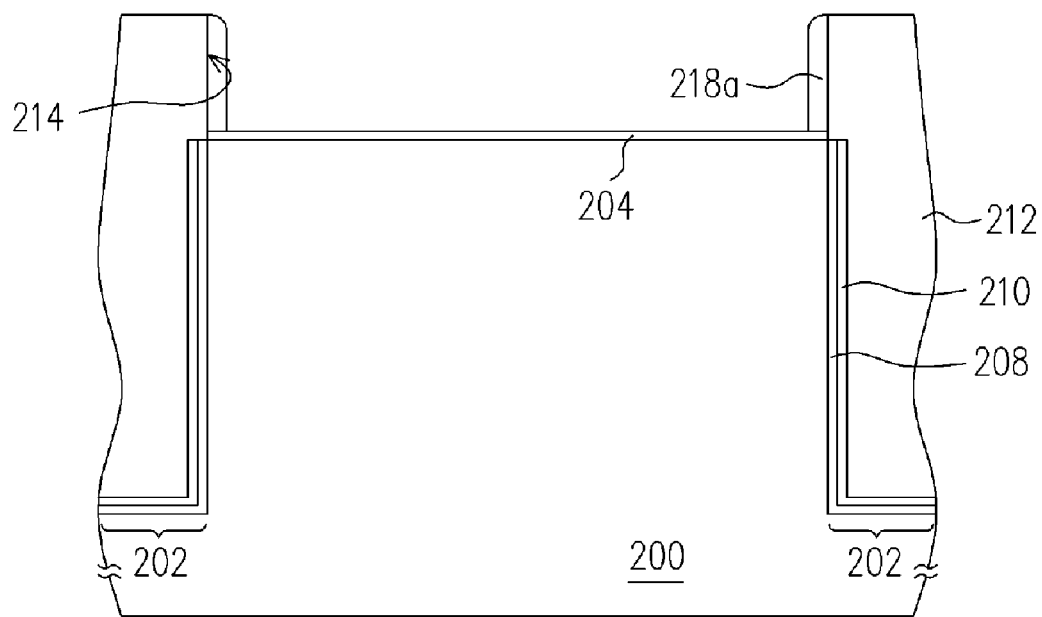
Figure 11C:
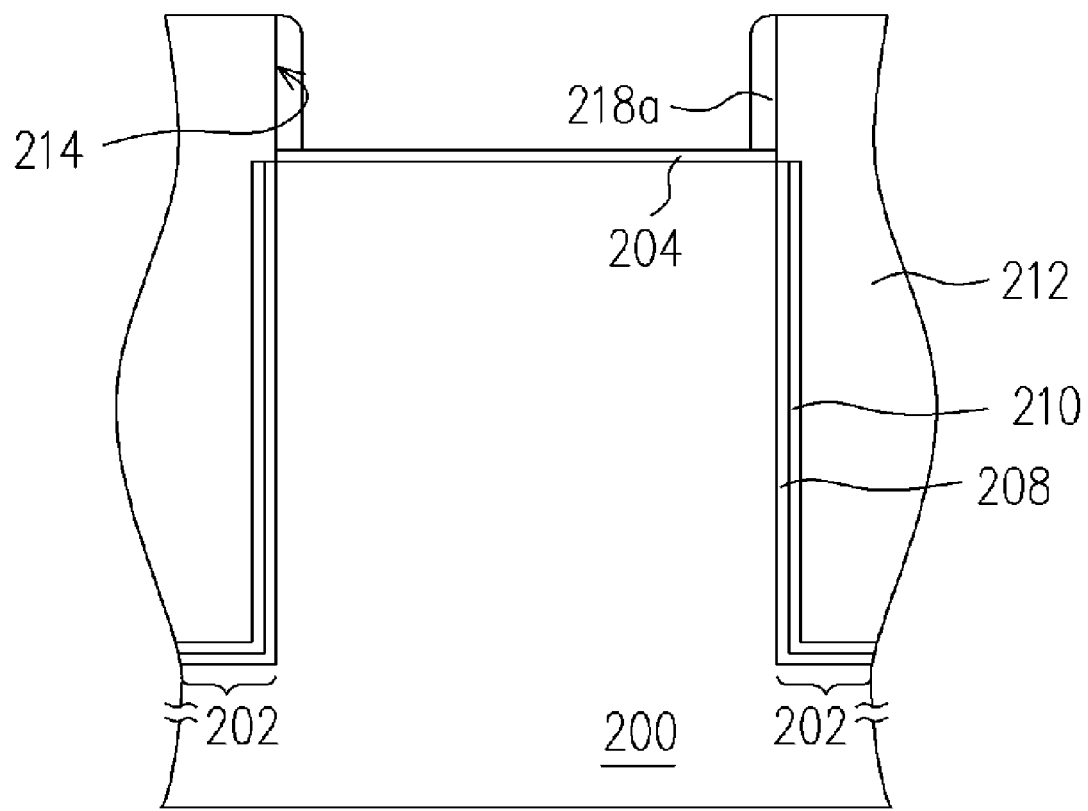

Then, referring to FIGS. 11(a), 11(b), and 11(c), an anisotropic etch process is performed to remove a portion of the nitride material layer 216 to expose the surfaces of the oxide layer 212 and the pad oxide layer 204, thus forming a circular nitride layer 218a.

Figure 12A:
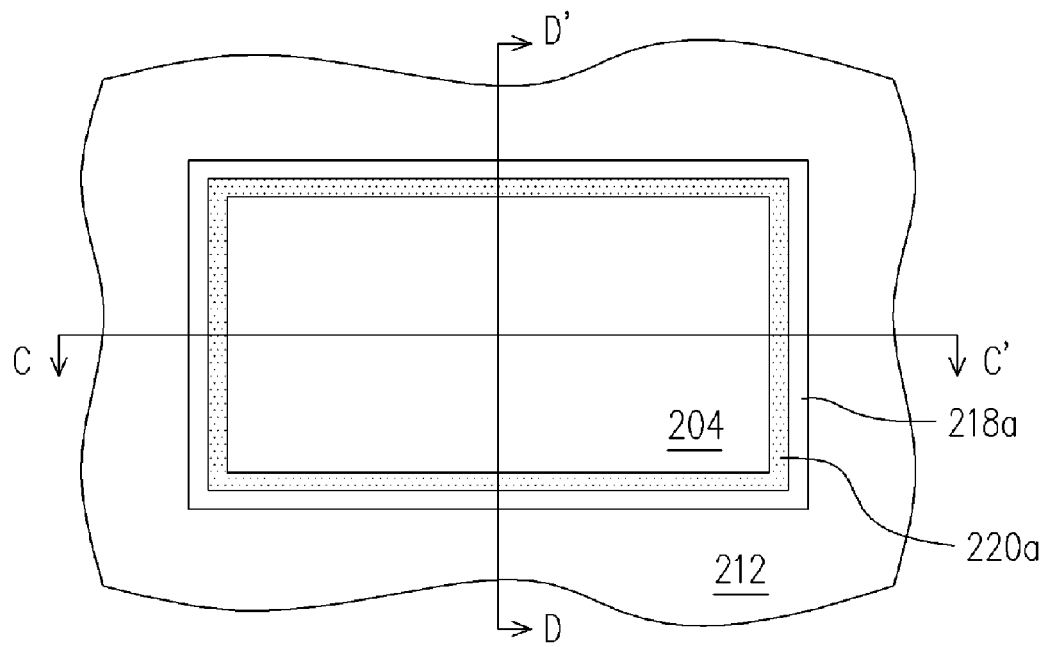
Figure 12B:
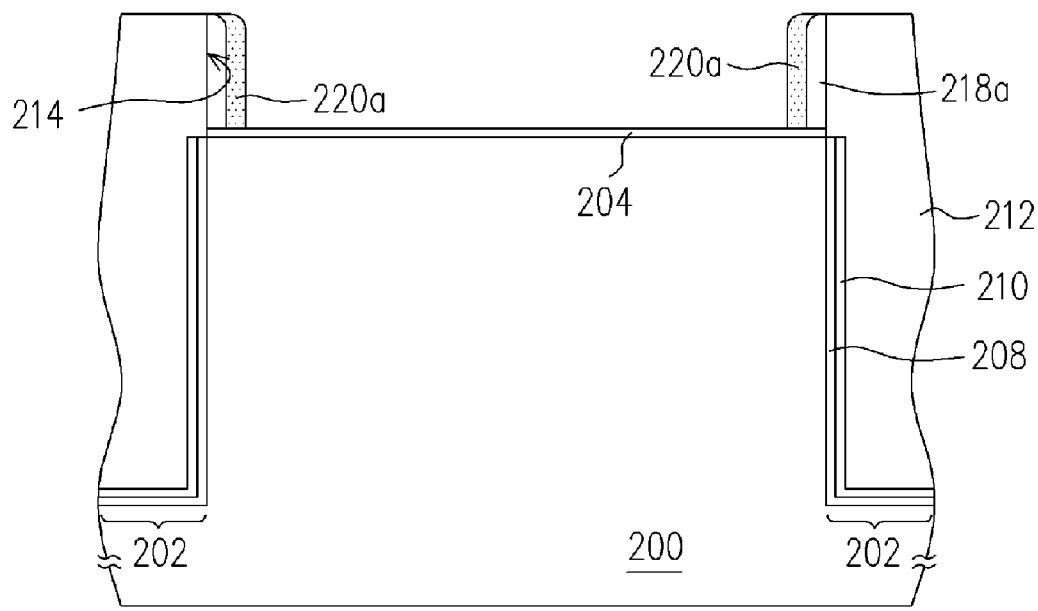
Figure 12C:
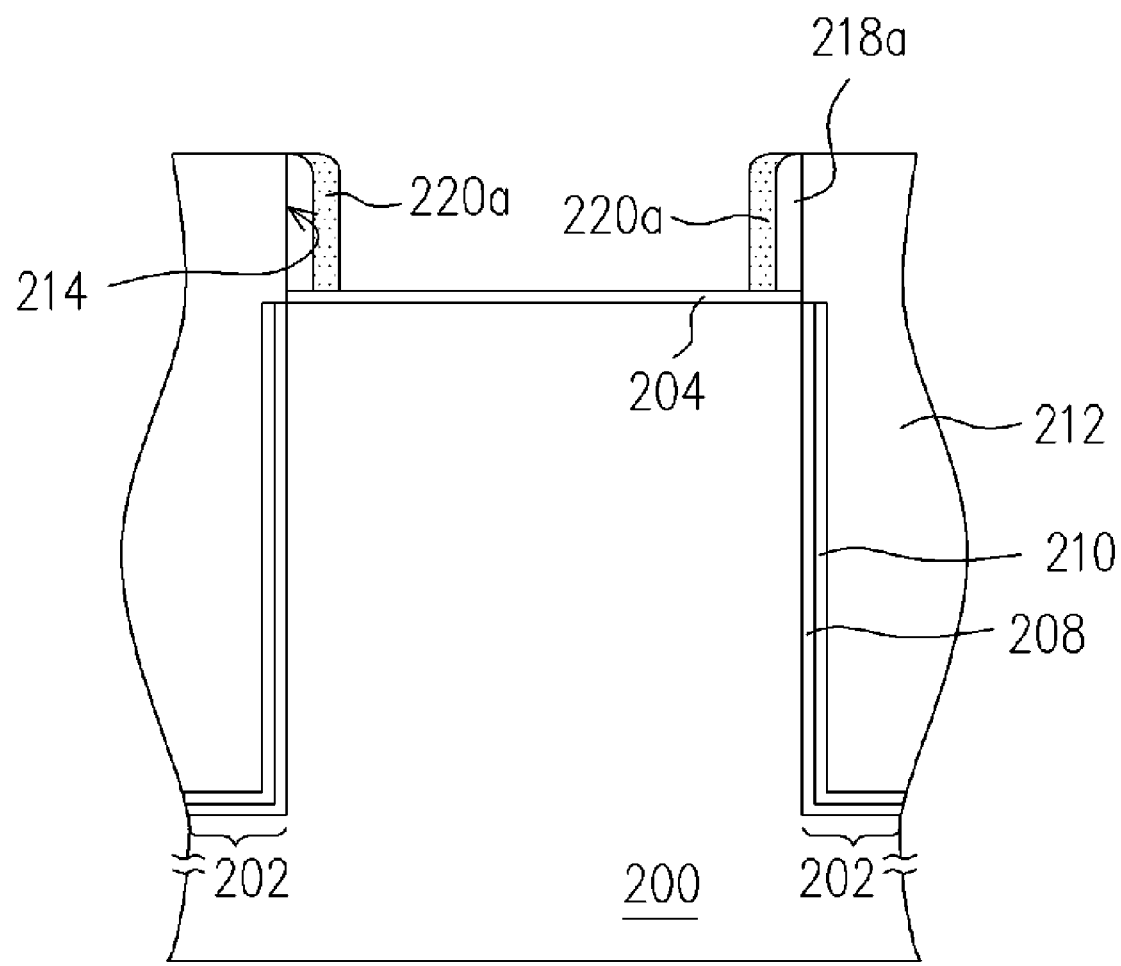

Then, referring FIGS. 12(a), 12(b), and 12(c), an oxide material layer (not shown) is formed to conformably cover the oxide layer 212, the circular nitride layer 218a, and the pad oxide layer 204. Then, an anisotropic etch process is performed to remove a portion of oxide material layer to expose the oxide layer 212 and a portion of the surface of the pad oxide layer 204, thus forming a circular oxide layer 220a.

Figure 13A:
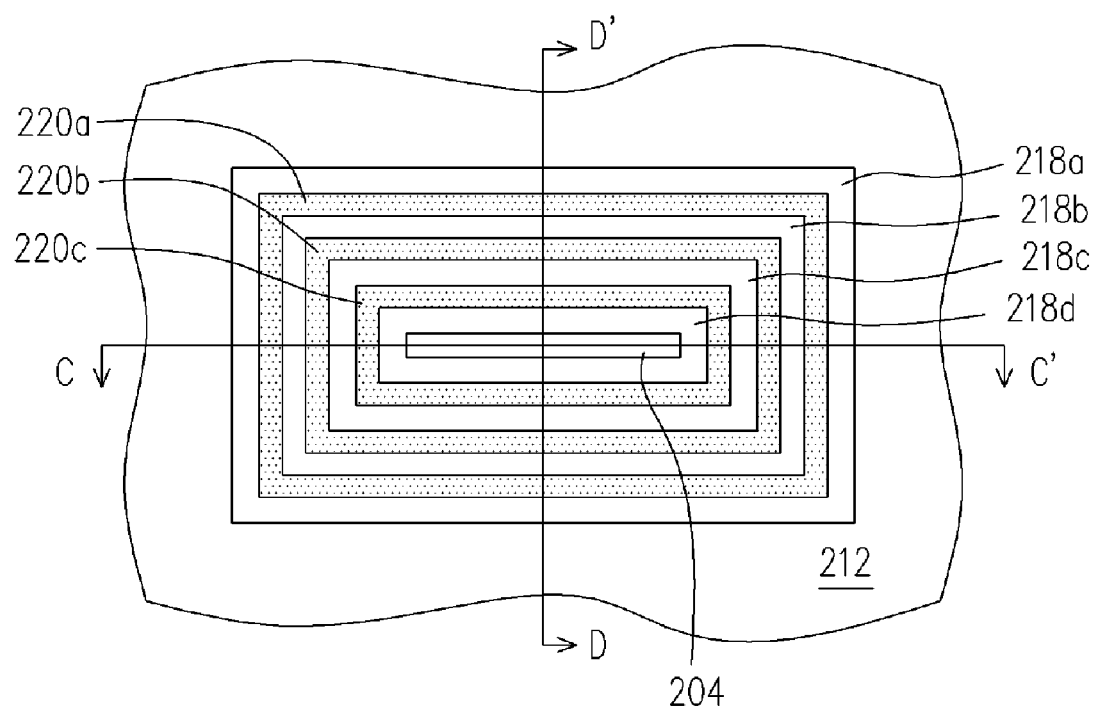
Figure 13B:
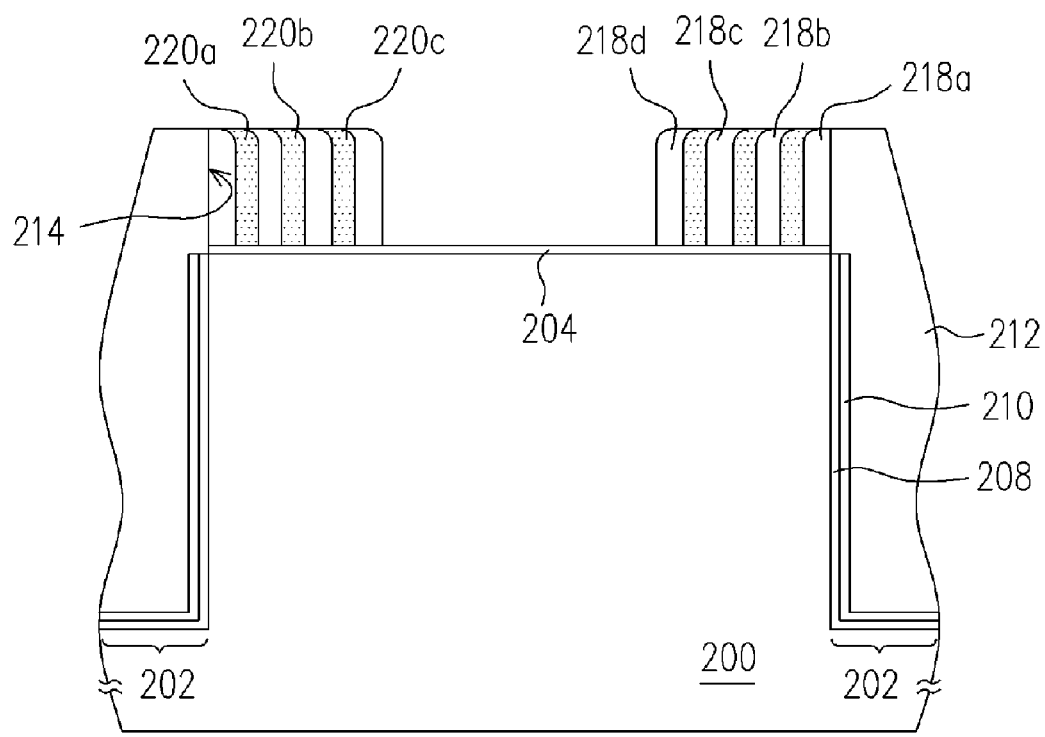
Figure 13C:
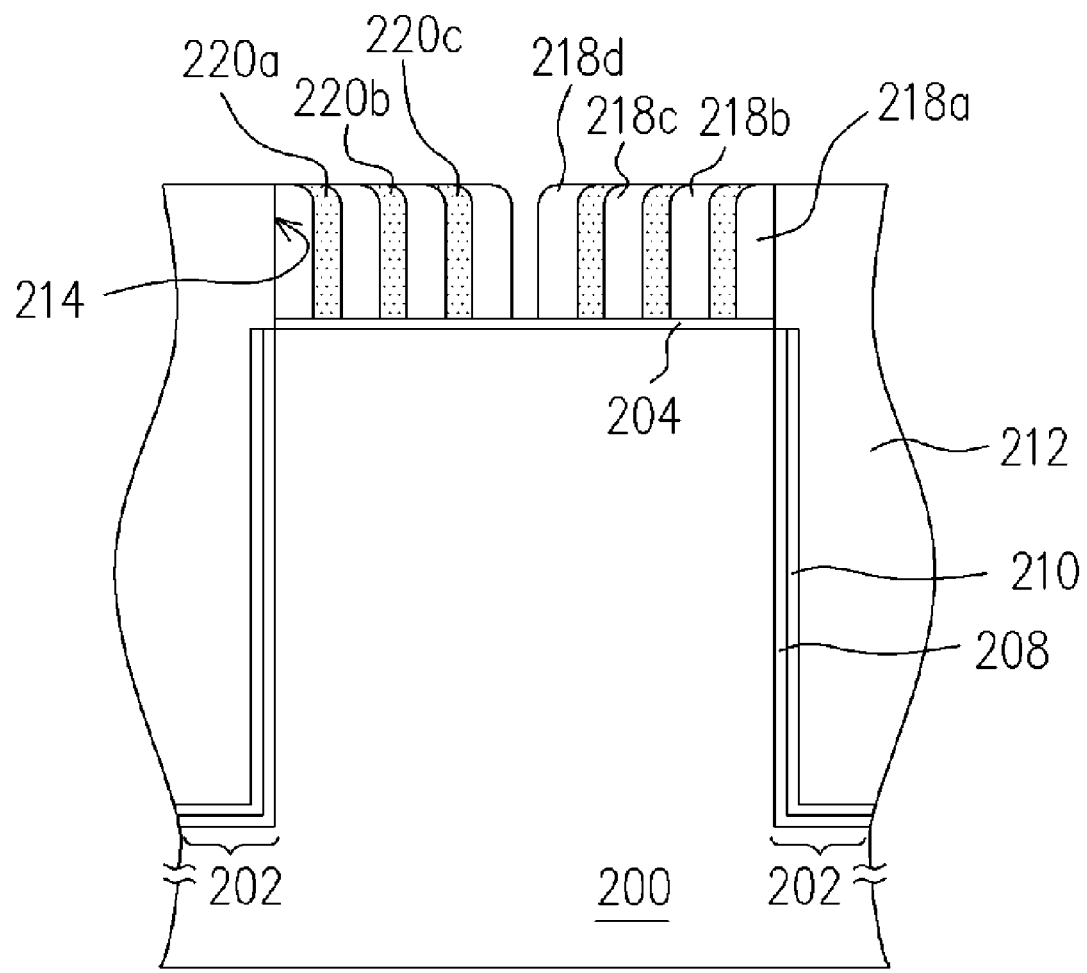

Subsequently, referring to FIGS. 13(a), 13(b), and 13(c), a circular nitride layer 218b, a circular oxide layer 220b, a circular nitride layer 218c, a circular oxide layer 220c, and a circular nitride layer 218d are formed through the same method.

Figure 14A:
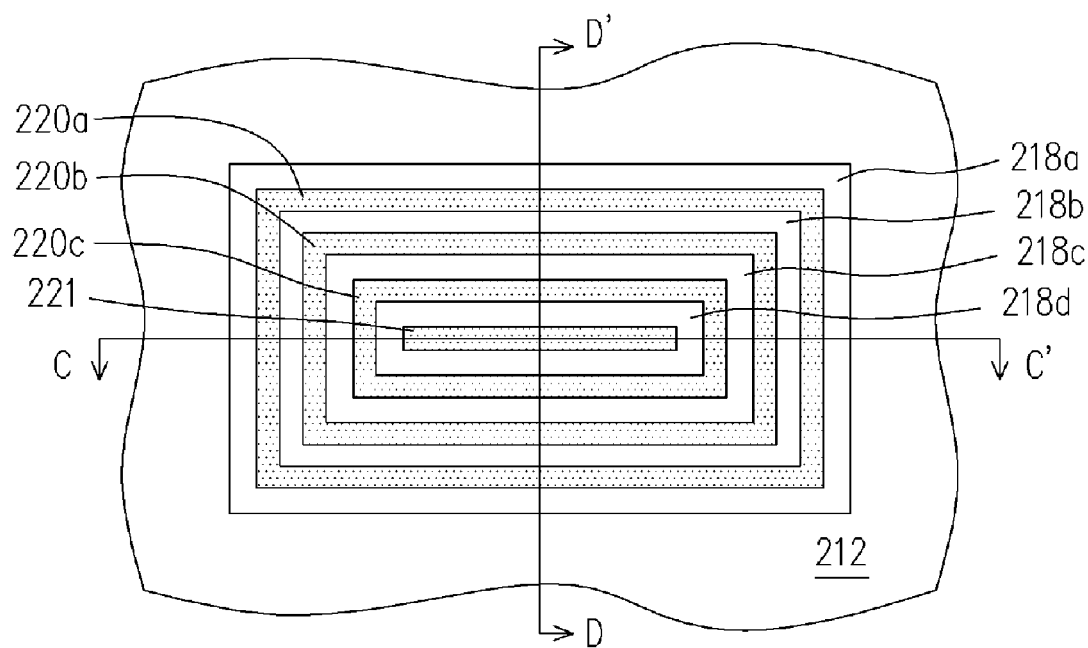
Figure 14B:
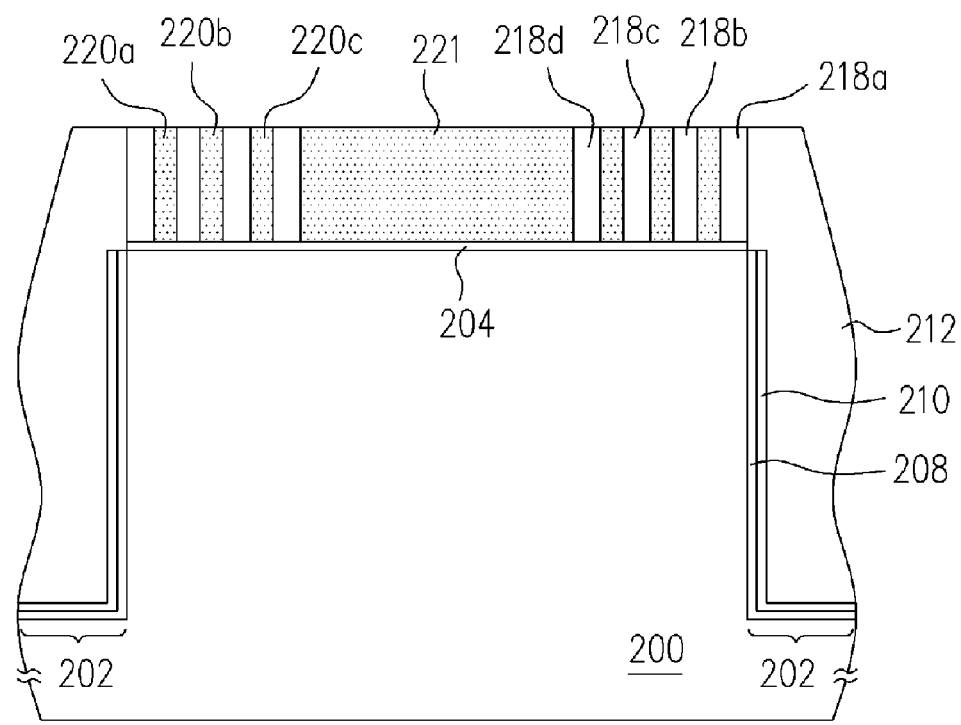
Figure 14C:
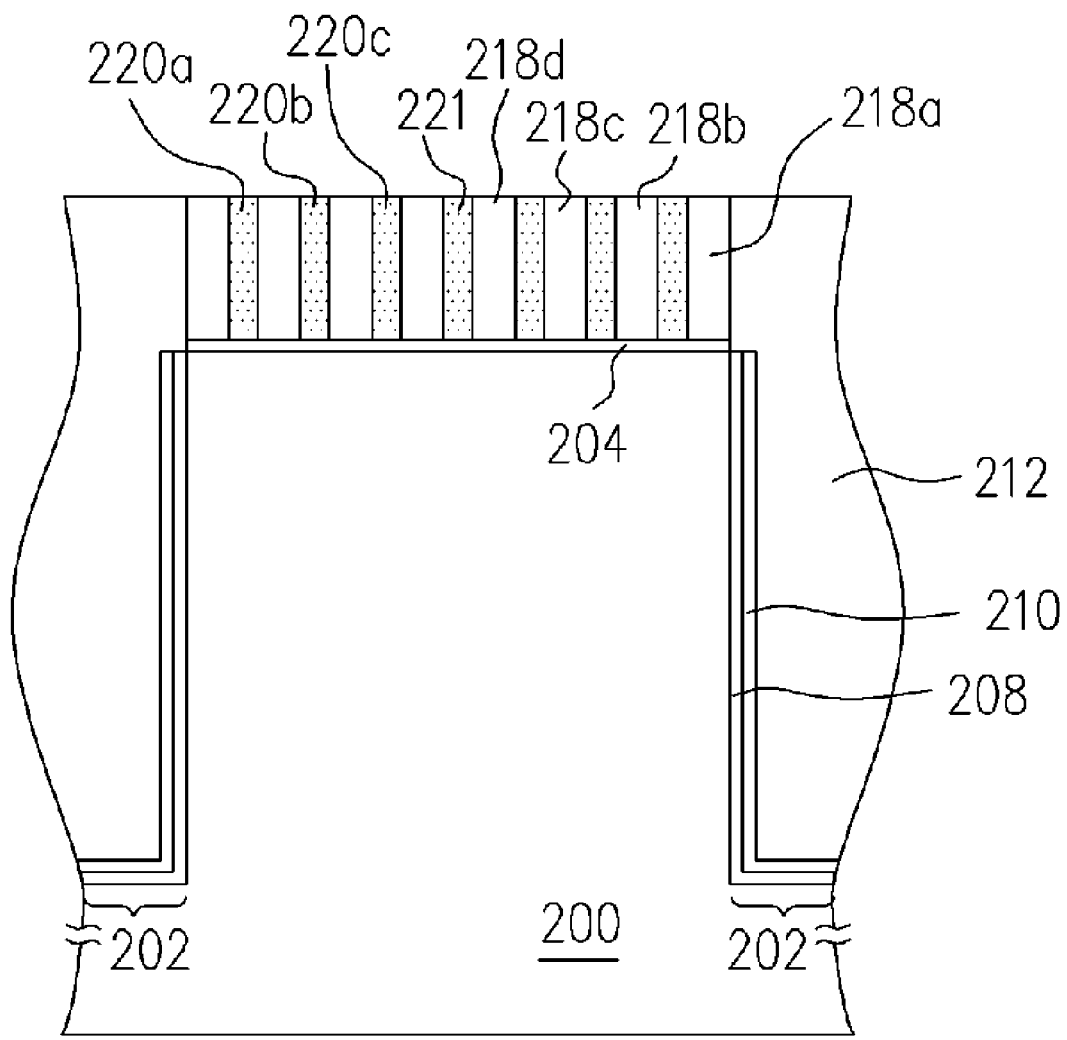

Next, referring to FIGS. 14(a), 14(b), and 14(c), an oxide material layer (not shown) is formed to cover the oxide layer 212, the pad oxide layer 204, the circular nitride layer 218a, the circular oxide layer 220a, the circular nitride layer 218b, the circular oxide layer 220b, the circular nitride layer 218c, the circular oxide layer 220c, and the circular nitride layer 218d. Then, a CMP is performed to flatten the material layer.

Figure 4:
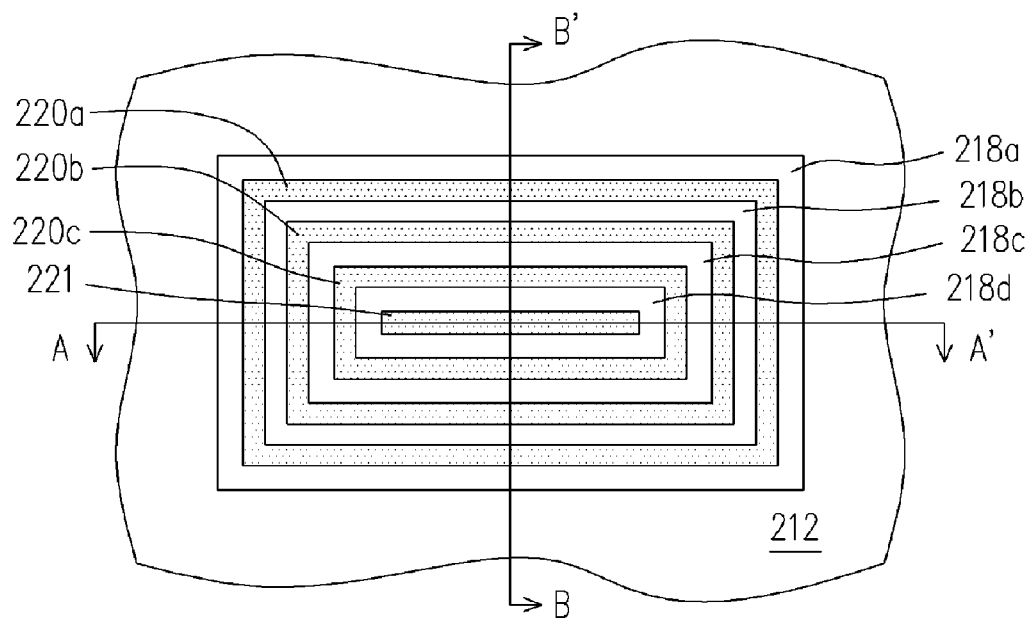
Figure 4:
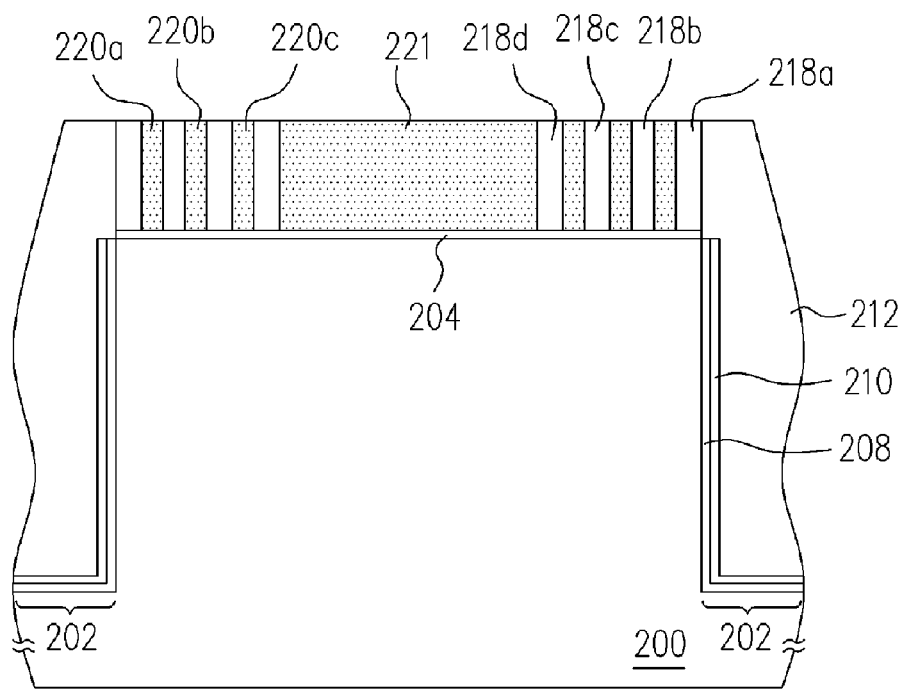
Figure 4C:
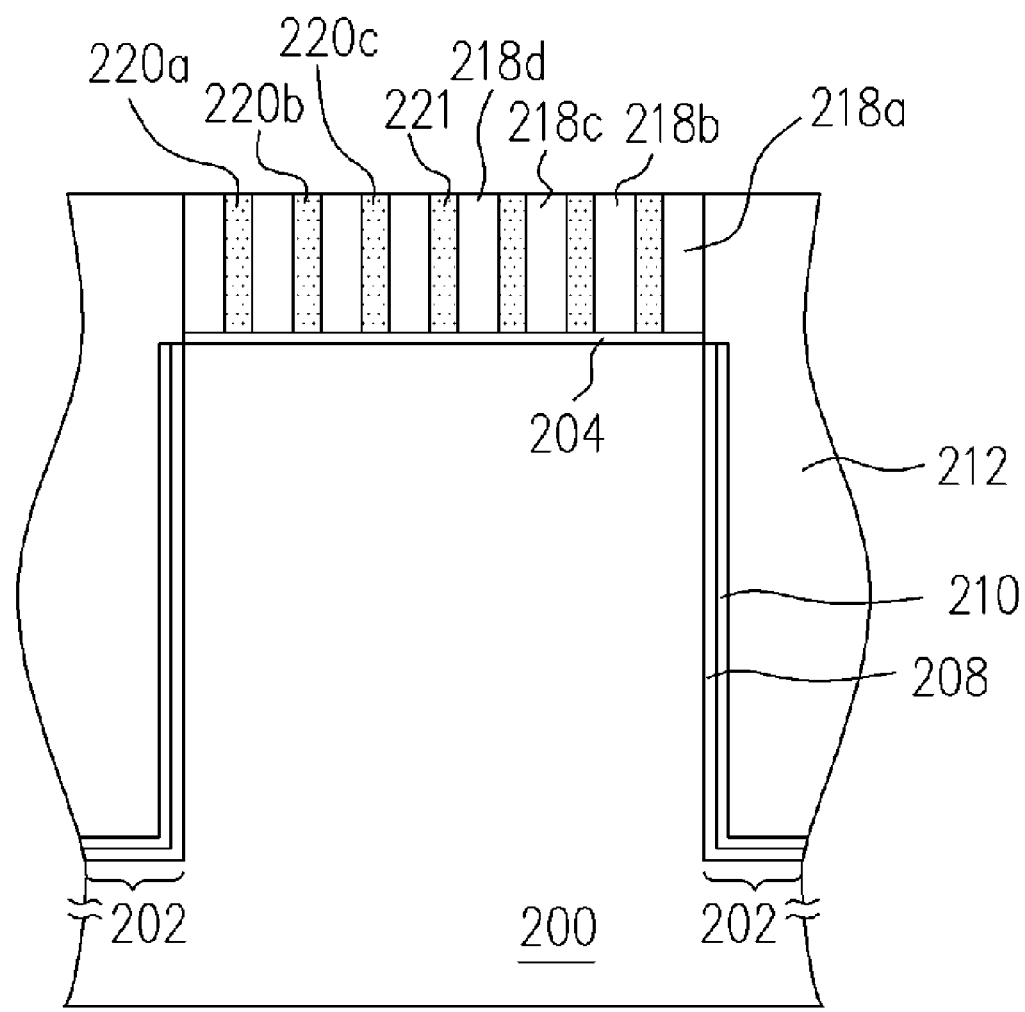
Figure 5A:
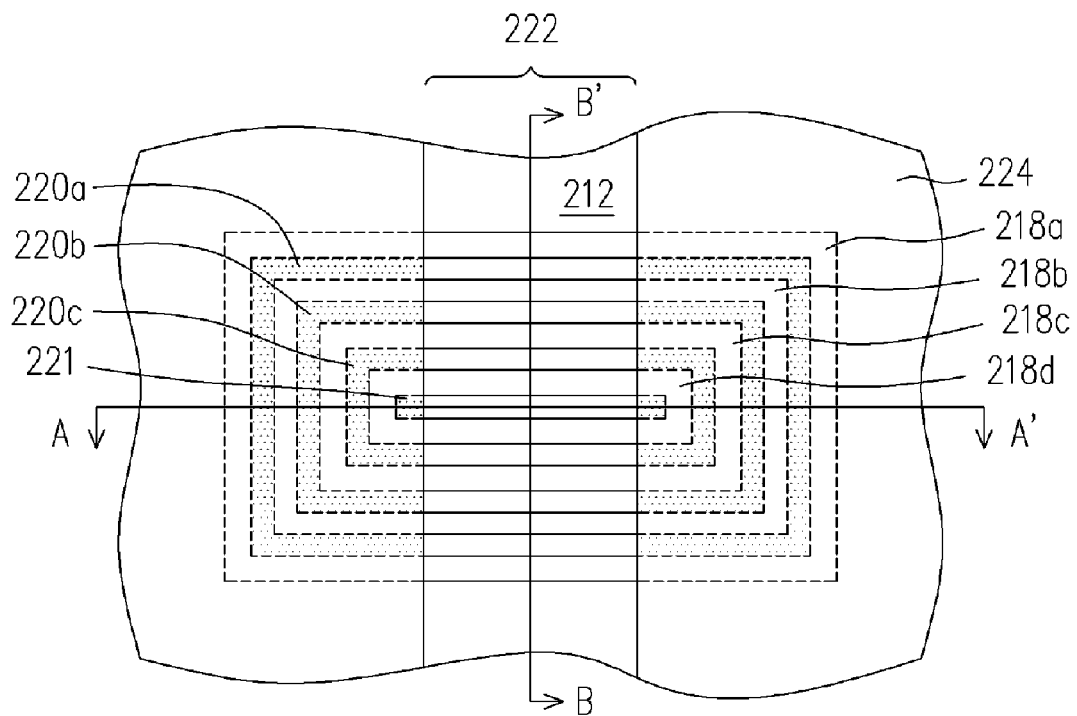
Figure 5B:
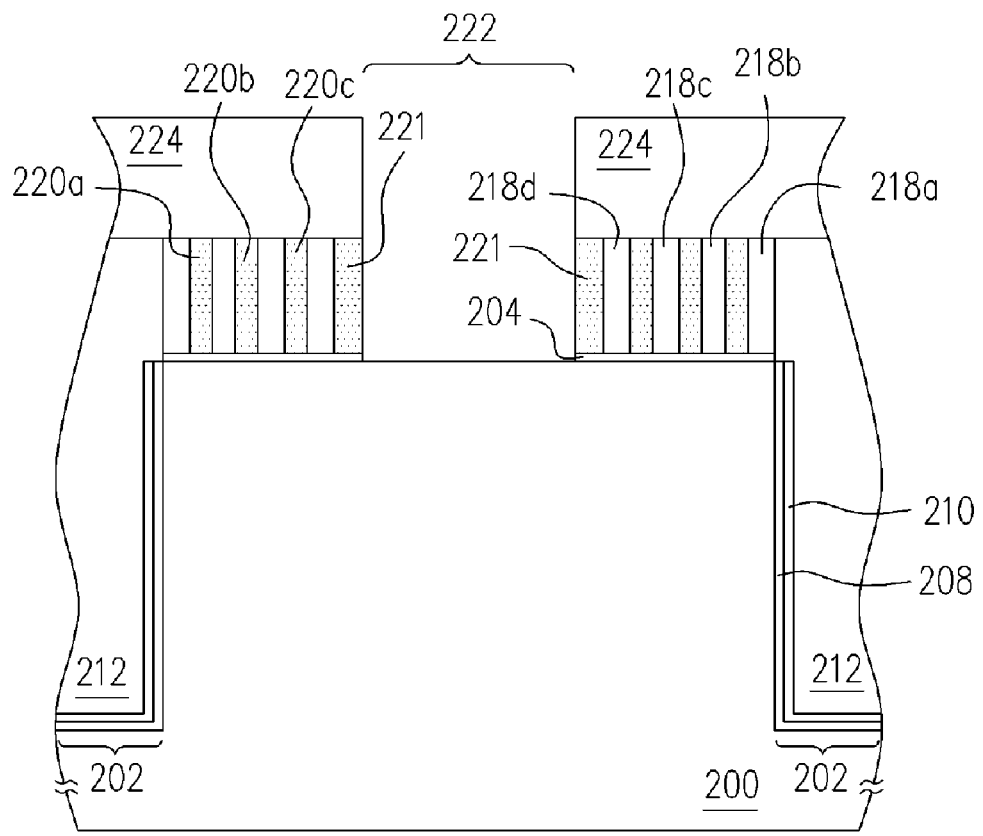
Figure 5C:
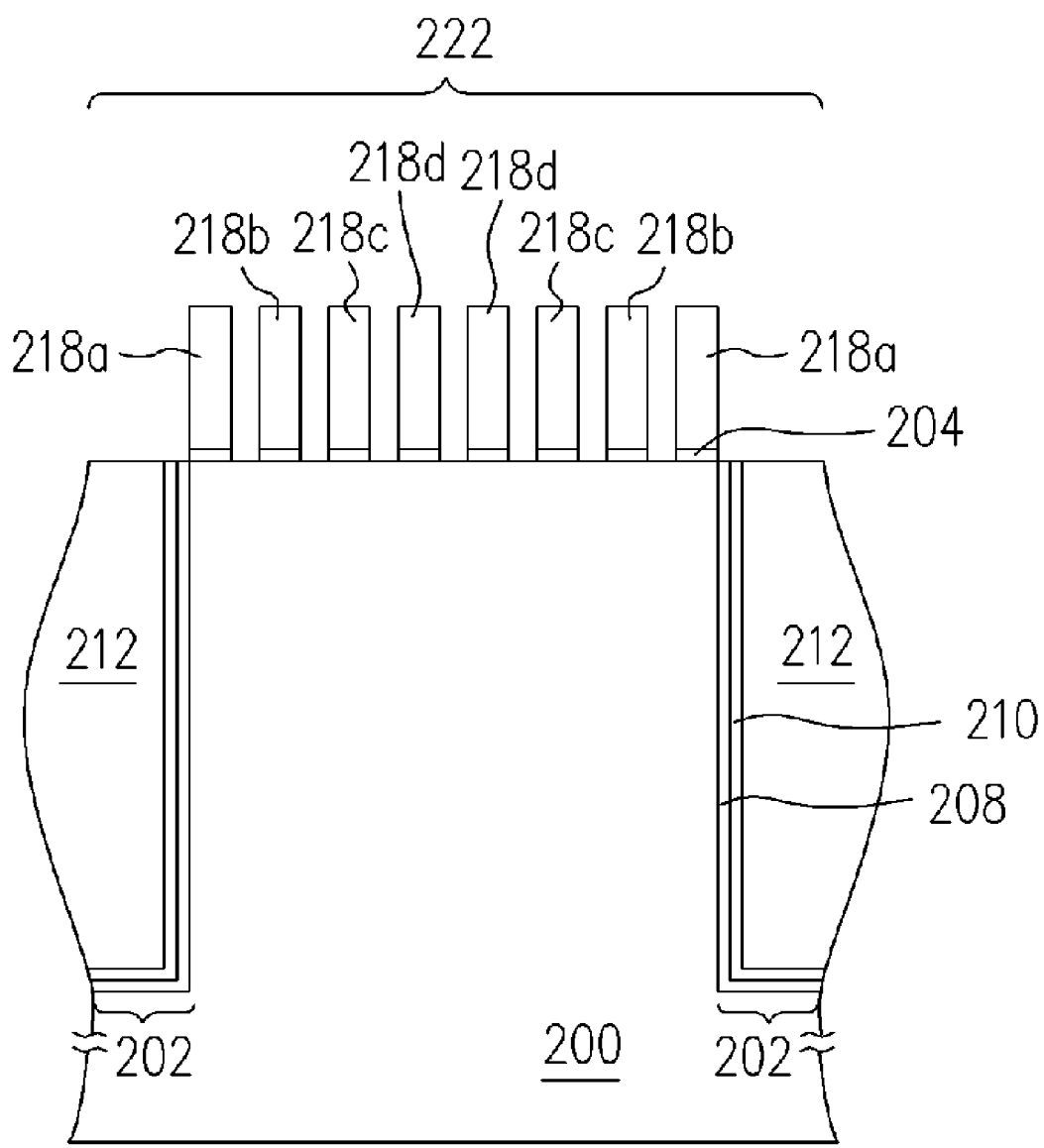

Then, following FIGS. 4(a), 4(b), and 4(c), referring to FIGS. 5(a), 5(b), and 5(c), a mask layer 224 is formed above the substrate 200 to cover a portion of the circular nitride layers 218a, 218b, 218c, and 218d, a portion of the circular oxide layers 220a, 220b, and 220c, and the oxide layer 22, and expose a region 222 prepared to form a gate. Then, by using the mask layer 224 as a mask, a portion of the oxide layer 212, a portion of the circular nitride layers 218a, 218b, 218c, and 218d, the circular oxide layers 220a, 220b, and 220c, and the oxide layer and a portion of the pad oxide layer 204, thus exposing a portion of the surface of the substrate 200. The method of moving the films is, for example, completely removing the circular oxide layers 220a, 220b, and 220c and the oxide layer 221 by means of, for example, an etching method. During this step, the pad oxide layer 204 not covered by the mask layer 224 and the circular nitride layer 218a, 218b, 218c, and 218d is not removed. Additionally, a portion of the oxide layer 212 and the circular oxide layers 220s, 220b and 220c not covered by the mask layer 224 are removed in this step.

Figure 6:
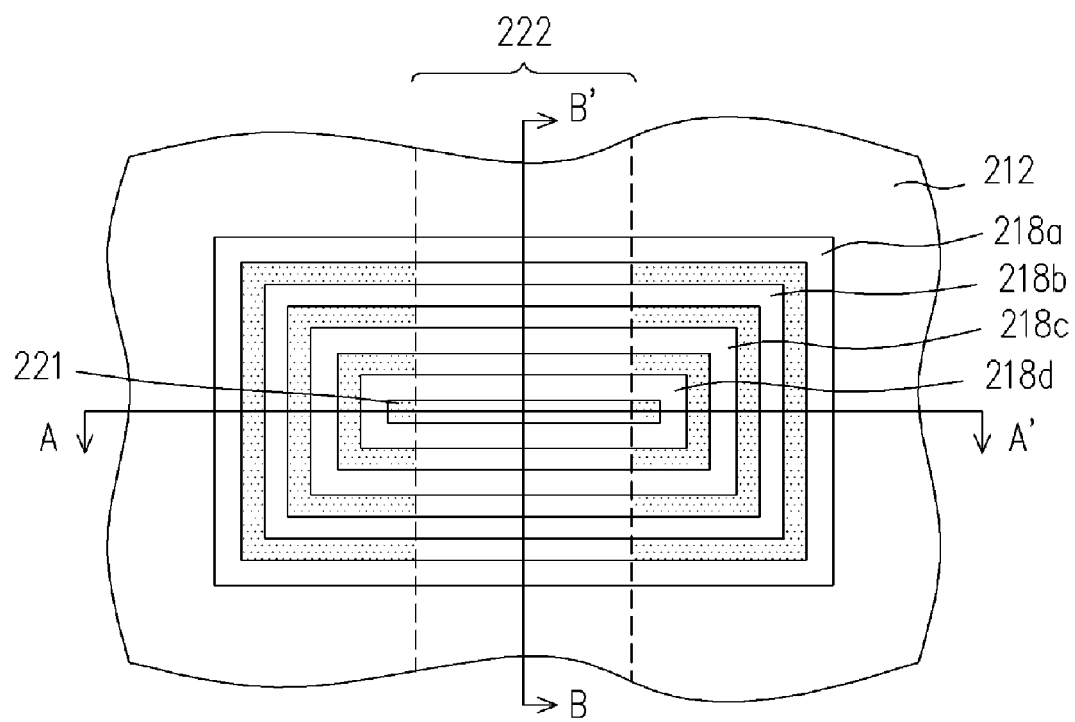
Figure 6:
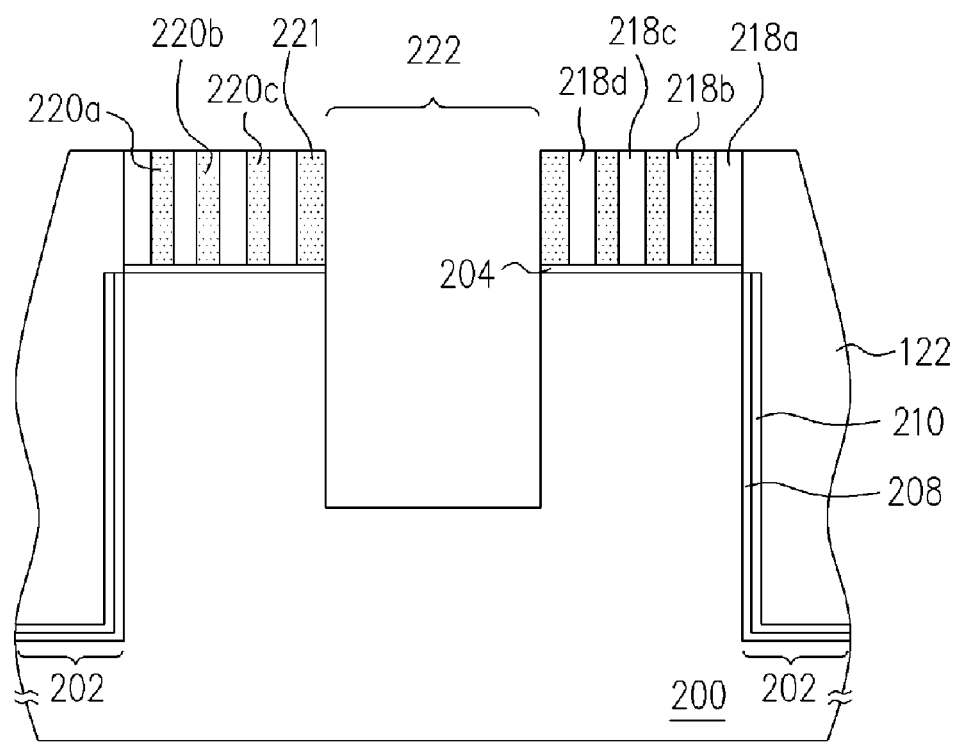
Figure 6C:
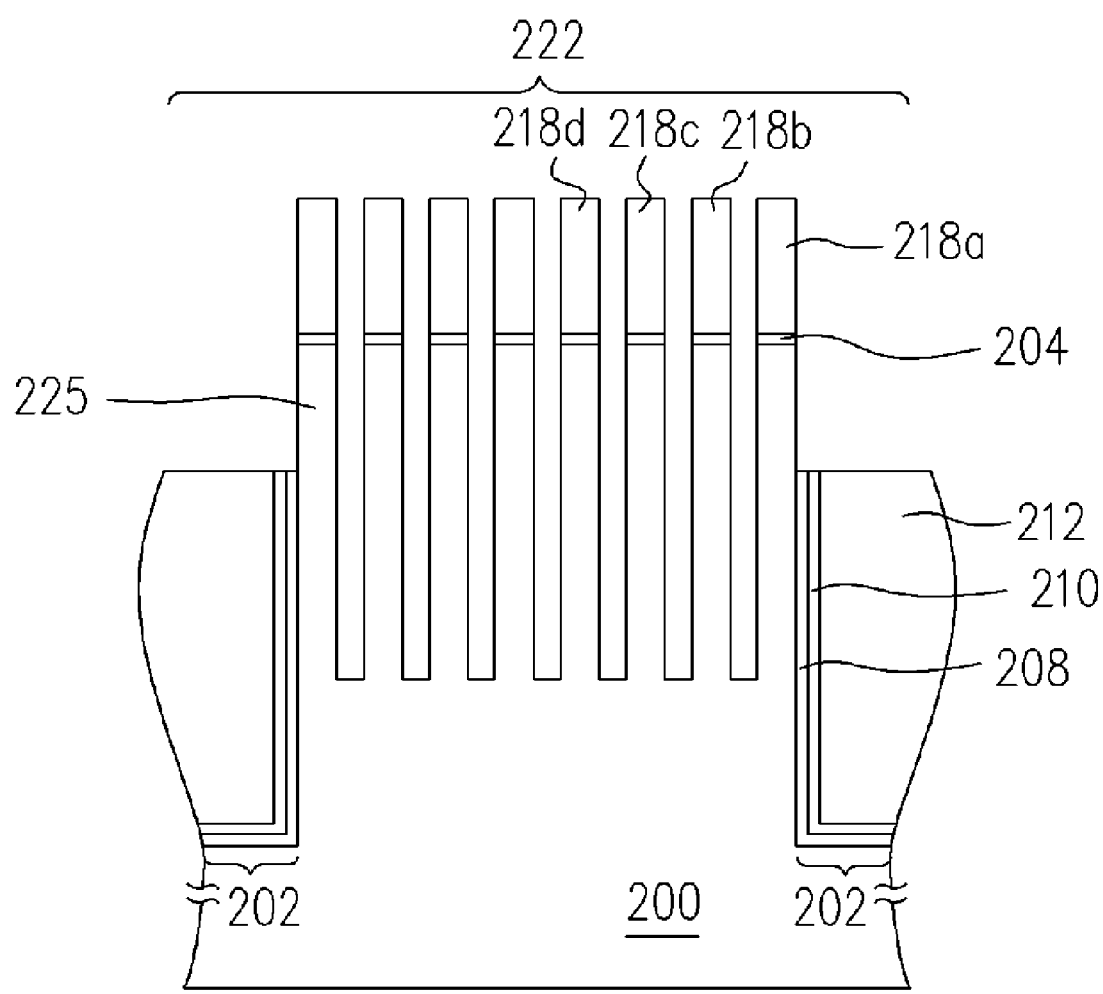

Next, referring to FIGS. 6(a), 6(b), and 6(c), by using the mask layer 224 and the circular nitride layers 218a, 218b, 218c, and 218d as masks, a portion of the substrate 200 and a portion of the oxide layer 212 are removed to form eight fin-type silicon layers 225. Next, the mask layer 224 is removed.

In one embodiment, after the fin-type silicon layers 225 are formed, a portion of the lining nitride layer 210 and a portion of the lining oxide layer 208 are removed to expose the surfaces of the fin-type silicon layers 225 by means of, for example, wet etching method.

Figure 7A:
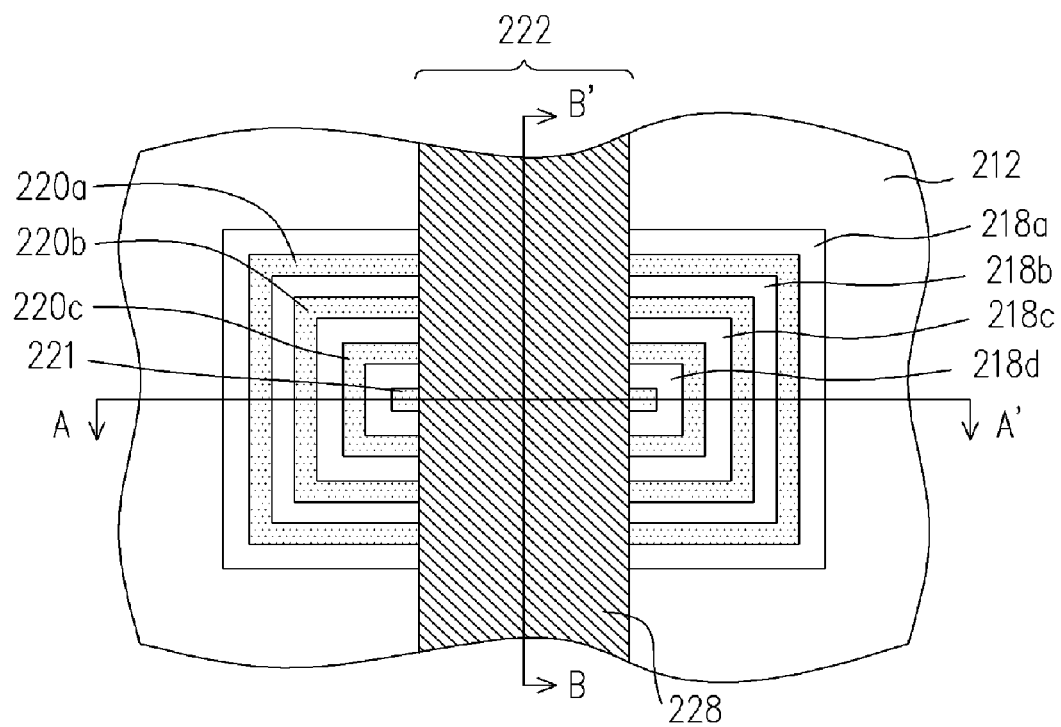
Figure 7B:
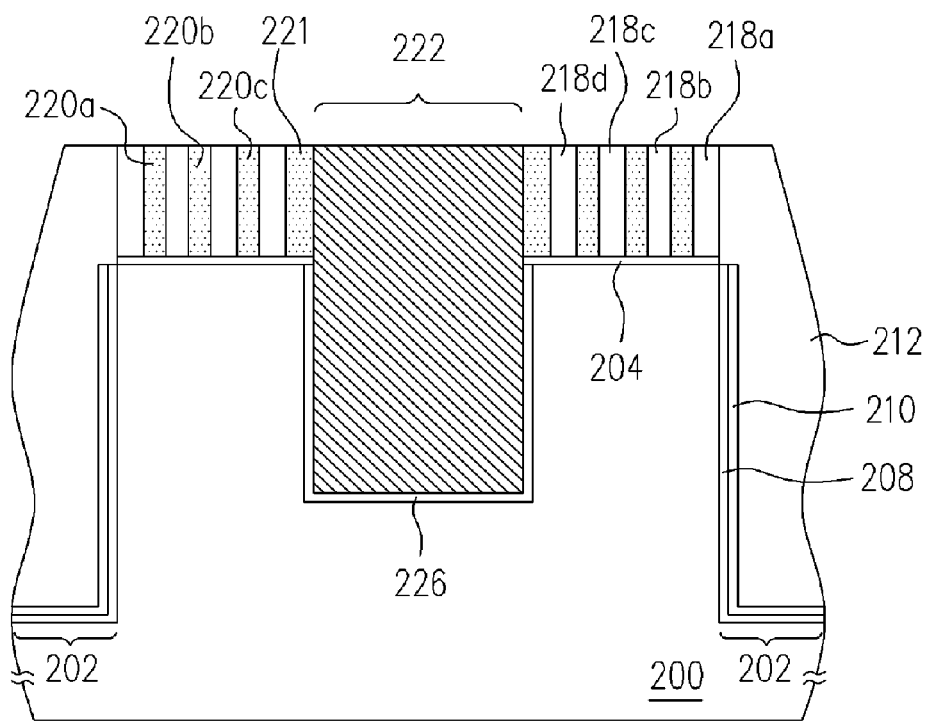
Figure 7C:
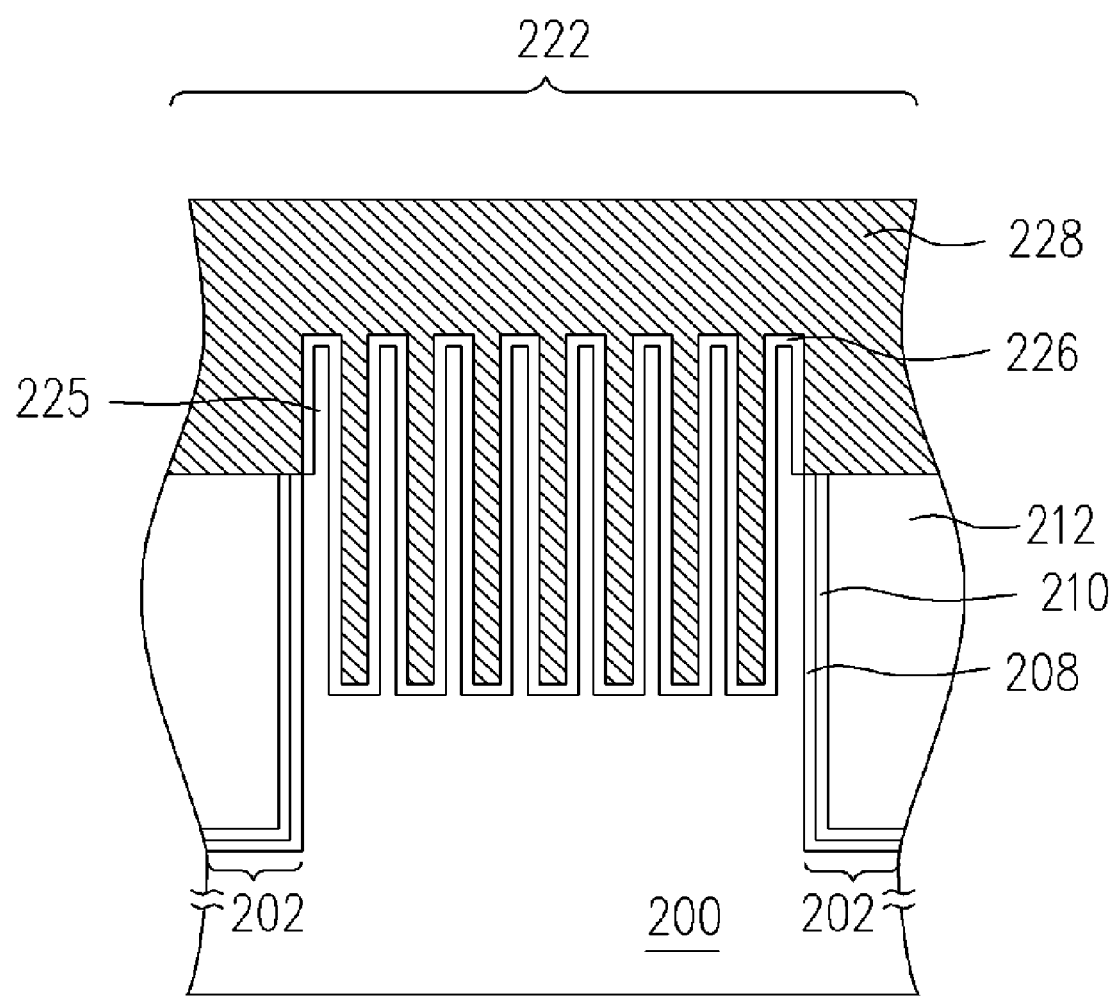

Subsequently, referring to FIGS. 7(a), 7(b), and 7(c), a gate oxide layer 226 is formed on the sidewalls of the fin-type silicon layers 225 and the surface of the exposed substrate 200. Then, a conductive layer 228 is formed in the region 222 above the substrate 200. The method of forming the conductive layer 228 is, for example, forming a conductive material layer (not shown) above the substrate 200. The conductive material layer fills in to the intervals between each of the fin-type silicon layers 225. Then, a portion of the conductive material layer is removed by means of CMP.

In one embodiment, after the gate oxide layer 226 is formed and before the conductive layer 228 is formed, for example, the circular nitride layers 218a, 218b, 218c, and 218d in the region 222 are removed.

Figure 8A:
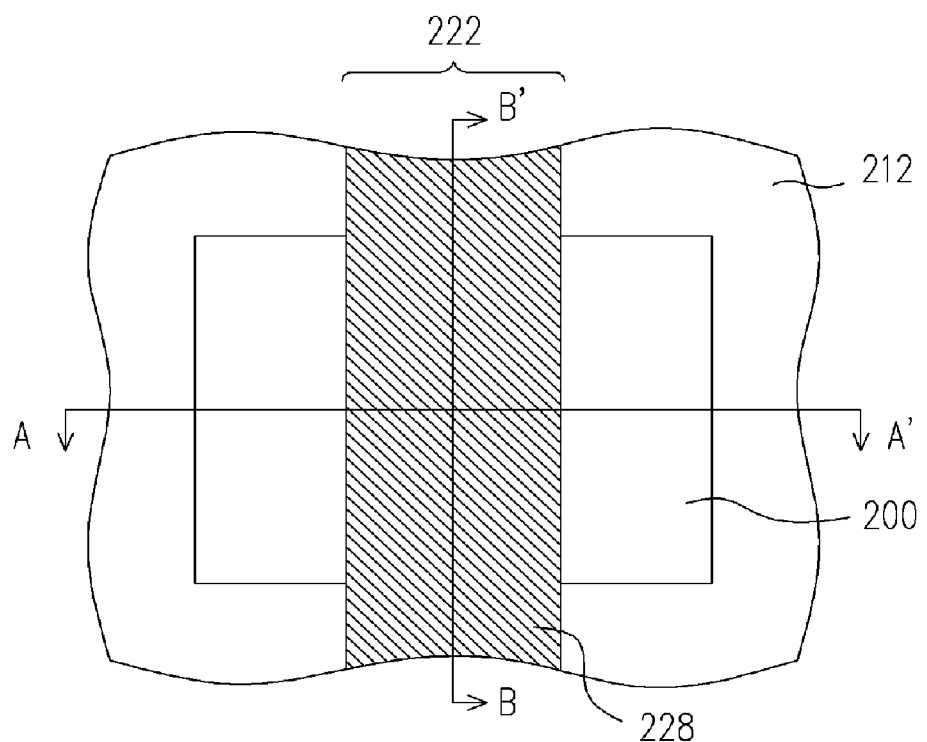
Figure 8B:
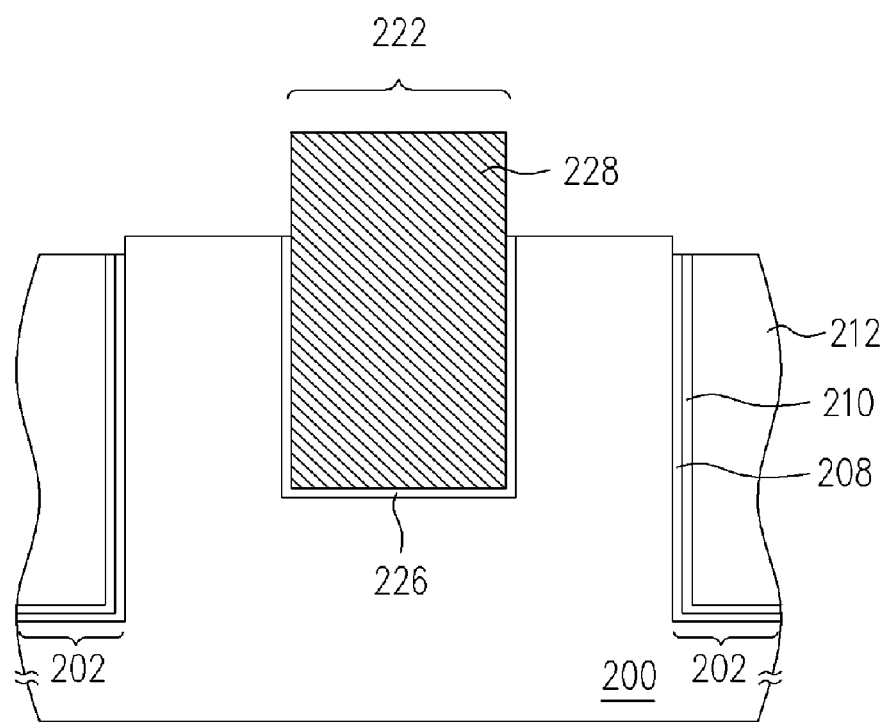
Figure 8C:
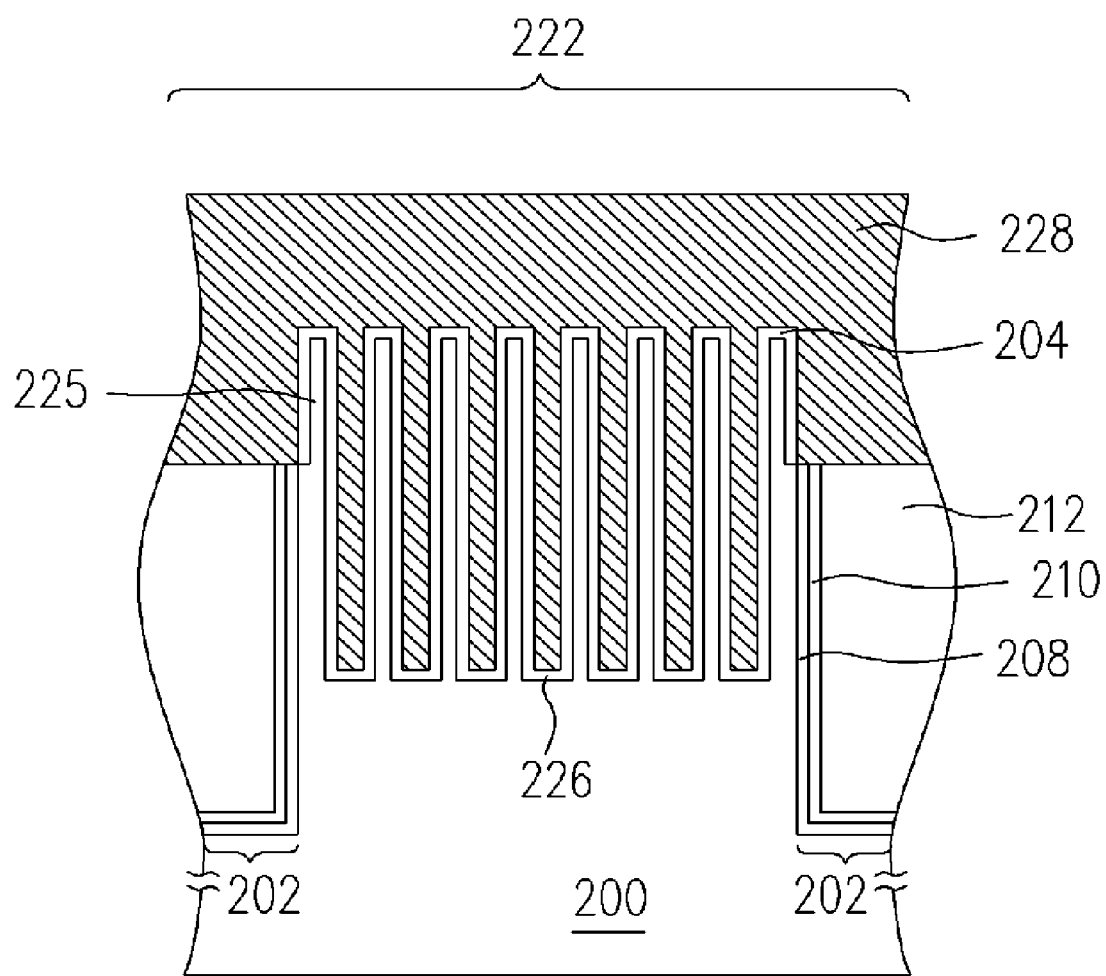
Figure 9:
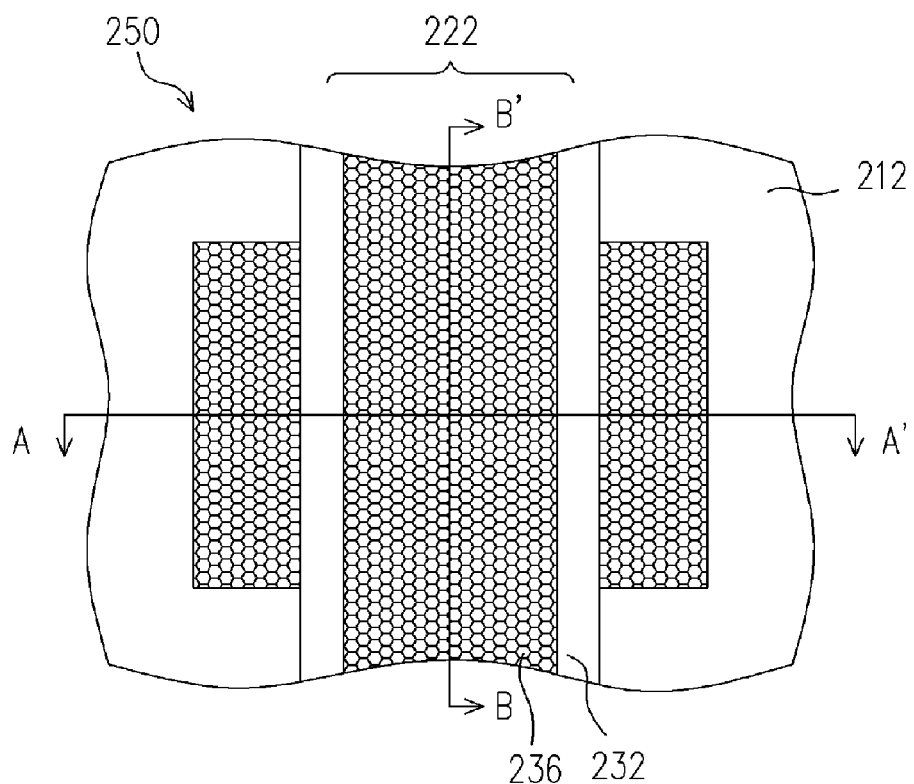
Figure 9:
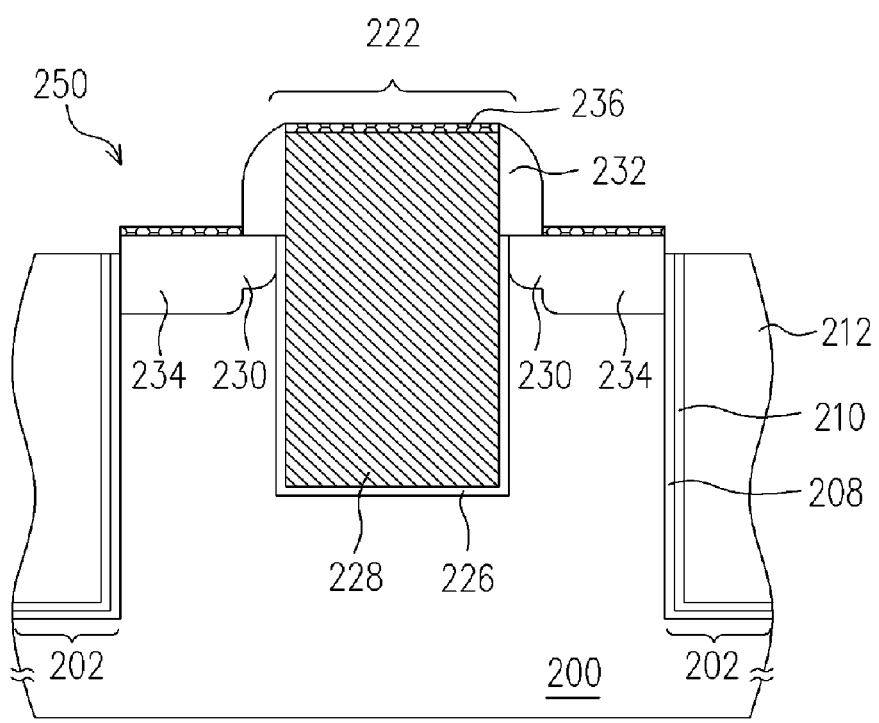
Figure 9:
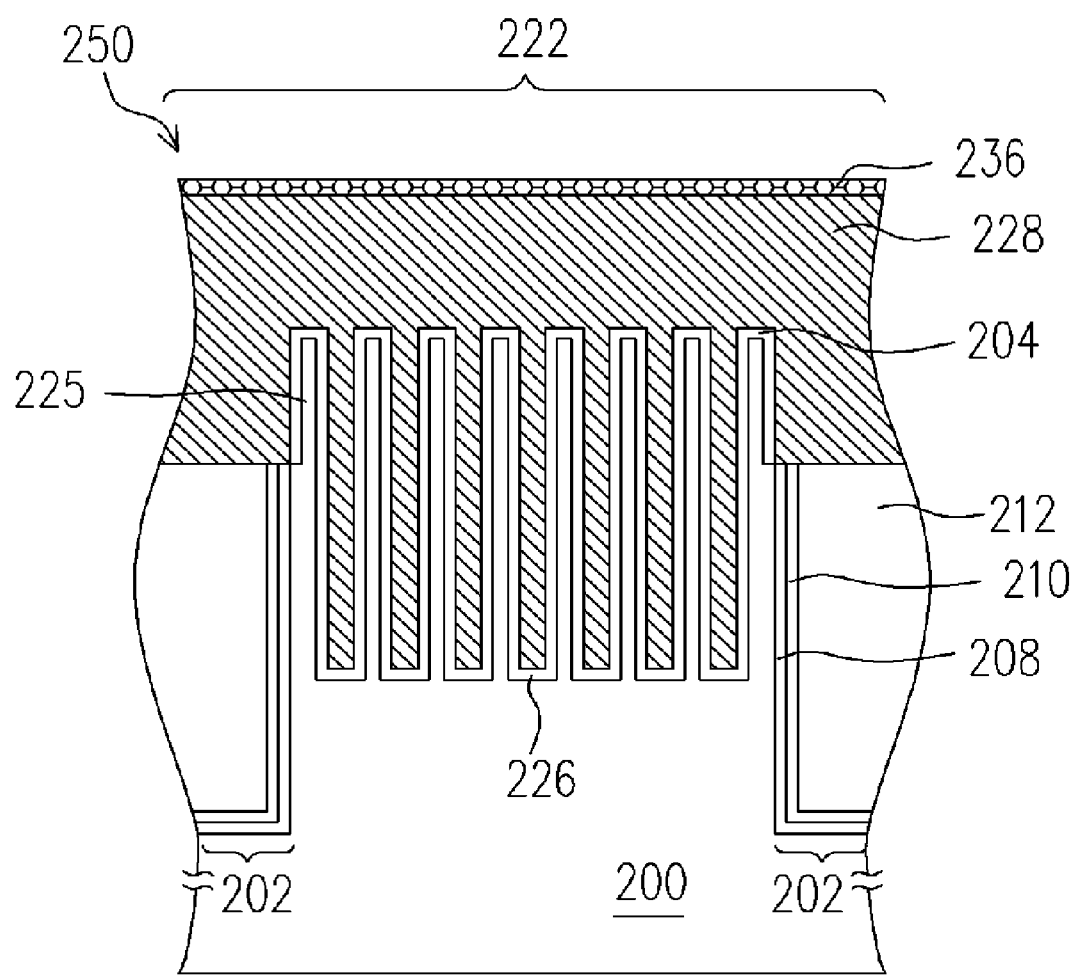

Referring to FIGS. 8(a), 8(b), and 8(c), the circular nitride layers 218a, 218b, 218c, and 218d, a portion of the oxide layer 212, the circular oxide layers 220a, 220b, and 220c, and the oxide layer 221 which are not covered by the conductive layer 228 are removed to expose the surface of the substrate 200. The method of removing the films comprises, for example, removing the exposed circular nitride layer 218 by means of, for example, using phosphoric acid as an etching solution to perform a wet etching process; and removing the exposed circular oxide layer 220 and oxide layer 221 by means of, for example, using BHF as an etching solution to perform a wet etching process. However, a portion of the oxide layer 212 is removed when removing the circular oxide layer 220 and the oxide layer 221.

Then, referring to FIGS. 9(a), 9(b), and 9(c), by using the conductive layer 228 as a mask, a lightly doped region 230 is formed in the substrate 200. In one embodiment, after the lightly doped region 230 is formed, a spacer 232 is further formed on the substrate 200 on both sides of the conductive layer 228. Subsequently, by using the conductive layer 228 and the spacer 232 as masks, a heavily doped region 234 is formed in the substrate to finish fabricating the multi-fin field effect transistor 250. The method of forming the lightly doped region 230, the spacer 232 and the heavily doped region 234 is well-known to those of ordinary skill in the art and will not be described any more.

In another embodiment, a metal silicide layer 236 is formed on the surfaces of the conductive layer 228 and the heavily doped region 234. The material of the metal silicide layer 236 is, for example, cobalt silicide, titanium silicide, tungsten silicide, tantalum silicide, molybdenum silicide and nickel silicide. The method of forming the metal silicide layer 236 comprises, for example, forming a metal layer (not shown) on the surfaces of the conductive layer 228 and the heavily doped region 234, wherein the material of the metal layer is, for example, Co, Ti, W, Ta, Mo, or Ni; then, forming a protective layer (not shown) on the surface of the metal layer, wherein the material of the protective layer is, for example, titanium nitride or another suitable material; and performing a thermal process to silicify the metal layer to form the metal silicide layer 236. Then, the protective layer and the metal layer that is not silicified are removed.

The multi-fin field effect transistor and the fabricating method thereof provided by the present invention have a multi-channel structure to increase the electrical capacity of a device, so as to improve the efficiency of the device and avoid the floating body effect caused by excessive accumulation of charges. In addition, the present invention does not employ the epitaxial process and thus does not have the problems such as the process takes a long time, the surface of the epitaxial layer is always difficult to be cleaned, and the process cannot be readily controlled and generate facet effect, thereby influencing subsequent processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a multi-fin field effect transistor, comprising:
   providing a substrate having at least one trench therein, the top surface of the substrate being covered with a pad layer;
   filling a first oxide layer into the trench and removing a portion of the pad layer to form an opening, wherein the top surface of the first oxide layer is higher than that of the substrate;
   forming a first circular or rectangular insulating layer and a second circular or rectangular insulating layer interlaced with each other on the sidewall of the opening;
   forming a mask layer above the substrate to cover a portion of the first circular or rectangular insulating layer and second circular or rectangular insulating layer, and exposing a region predetermined to form a gate;
   removing a portion of the second circular or rectangular insulating layer by using the mask layer as a mask to expose a portion of the surface of the substrate;
   removing a portion of the substrate by using the mask layer and the first circular or rectangular insulating layer as masks to form two fin-type layers;
   removing the mask layer;
   forming a gate oxide layer on the sidewalls of the two fin-type layers and the surface of the substrate;
   forming a conductive layer in the region above the substrate;
   removing the first circular or rectangular insulating layer, a portion of the first oxide layer and the second circular or rectangular insulating layer which are not covered by the conductive layer, so as to expose the surface of the substrate; and
   forming a lightly doped region in the substrate by using the conductive layer as a mask.

2. The method of fabricating a multi-fin field effect transistor as claimed in claim 1, wherein the method of providing a substrate having at least one trench therein, the top surface of the substrate being covered with a pad layer comprises:
   providing a substrate and sequentially forming a pad layer and a patterned photoresist layer on the substrate;
   removing the pad layer and a portion of the substrate which are not covered by the patterned photoresist layer, so as to form a trench; and
   removing the patterned photoresist layer.

3. The method of fabricating a multi-fin field effect transistor as claimed in claim 1, wherein before the first oxide layer is filled into the trench, it further comprises sequentially forming a lining oxide layer and a lining nitride layer on the surface of the substrate on the sidewall of the trench.

4. The method of fabricating a multi-fin field effect transistor as claimed in claim 1, further comprising:
   forming a spacer on the substrate on both sides of the conductive layer; and
   forming a heavily doped region in the substrate by using the conductive layer and the spacer as masks.

5. The method of fabricating a multi-fin field effect transistor as claimed in claim 4, wherein after the heavily doped region is formed, it further comprises forming a metal silicide layer on the surfaces of conductive layer and the heavily doped region.

6. The method of fabricating a multi-fin field effect transistor as claimed in claim 5, wherein the material of the metal silicide layer comprises cobalt silicide, titanium silicide, tungsten silicide, tantalum silicide, molybdenum silicide, and nickel silicide.

7. The method of fabricating a multi-fin field effect transistor as claimed in claim 1, the method of forming the first circular or rectangular insulating layer and the second circular or rectangular insulating layer interlaced with each other on the sidewall of the opening comprises:
   forming a first insulating material layer conformably above the substrate;
   performing an anisotropic etch process to remove a portion of the first insulating material layer, so as to form a first circular or rectangular insulating spacer;
   forming a second insulating material layer conformably above the substrate;
   performing an anisotropic etch process to remove a portion of the second insulating material layer, so as to form a second circular or rectangular insulating spacer; and
   performing a chemical mechanical polishing process to remove a portion of the first circular or rectangular insulating spacer, the second circular or rectangular insulating spacer, and the first oxide layer.

8. The method of fabricating a multi-fin field effect transistor as claimed in claim 7, wherein before the chemical mechanical polishing process is performed, it comprises:
   filling the first circular or rectangular insulating material or the second circular or rectangular insulating material into the opening above the substrate.

9. The method of fabricating a multi-fin field effect transistor as claimed in claim 1, wherein the first circular or rectangular insulating layer is a silicon nitride layer and the second circular or rectangular insulating layer is a silicon oxide layer.

10. The method of fabricating a multi-fin field effect transistor as claimed in claim 3, wherein after the two fin-type silicon layers are formed, it further comprises removing a portion of the lining nitride layer and the lining oxide layer to expose the surfaces of the two fin-type silicon layers.

11. The method of fabricating a multi-fin field effect transistor as claimed in claim 1, wherein the pad layer comprises a pad oxide layer and a pad nitride layer.

12. The method of fabricating a multi-fin field effect transistor as claimed in claim 1, wherein the method of forming the first oxide layer comprises performing a deposition process by using TEOS as a gas supply.

13. The method of fabricating a multi-fin field effect transistor as claimed in claim 1, wherein after the gate oxide layer is formed and before the conductive layer is formed, it further comprises removing the first circular or rectangular insulating layer in the region.

* * * * *